United States Patent
Kwak et al.

(10) Patent No.: US 11,184,030 B2
(45) Date of Patent: Nov. 23, 2021

(54) STORAGE CONTROLLER FOR CORRECTING ERROR, STORAGE DEVICE INCLUDING THE SAME, AND OPERATING METHOD THEREOF

(71) Applicant: SAMSUNG ELECTRONICS CO., LTD., Suwon-si (KR)

(72) Inventors: Heeyoul Kwak, Suwon-si (KR); Jae Hun Jang, Hwaseong-si (KR); Hong Rak Son, Anyang-si (KR); Dong-Min Shin, Seoul (KR); Geunyeong Yu, Seongnam-si (KR); Kangseok Lee, Seoul (KR); Hyunseung Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/917,101

(22) Filed: Jun. 30, 2020

(65) Prior Publication Data
US 2021/0184699 A1    Jun. 17, 2021

(30) Foreign Application Priority Data
Dec. 11, 2019    (KR) .................. 10-2019-0164302

(51) Int. Cl.
| | | |
|---|---|---|
| H03M 13/00 | (2006.01) |
| H03M 13/15 | (2006.01) |
| H03M 13/11 | (2006.01) |
| G11C 29/42 | (2006.01) |
| G06F 11/30 | (2006.01) |

(52) U.S. Cl.
CPC ..... H03M 13/1575 (2013.01); G06F 11/3037 (2013.01); G11C 29/42 (2013.01); H03M 13/1105 (2013.01); H03M 13/1168 (2013.01); H03M 13/159 (2013.01)

(58) Field of Classification Search
CPC ........ H03M 13/1575; H03M 13/1105; H03M 13/1168; H03M 13/159; G11C 29/42; G06F 11/3037
See application file for complete search history.

(56) References Cited

U.S. PATENT DOCUMENTS

| | | |
|---|---|---|
| 8,266,367 B2 | 9/2012 | Yu et al. |
| 8,954,817 B2 | 2/2015 | Iwasaki |
| 9,152,495 B2 | 10/2015 | Losh et al. |
| 9,164,832 B2 | 10/2015 | Gaertner et al. |
| 9,996,419 B1 | 6/2018 | Bruce et al. |
| 2013/0111113 A1 | 5/2013 | Harari et al. |

(Continued)

*Primary Examiner* — Christine T. Tu
(74) *Attorney, Agent, or Firm* — Sughrue Mion, PLLC

(57) ABSTRACT

An operating method of a storage controller which includes a high level decoder and a low level decoder includes generating first data that is a result of decoding initial data read from a nonvolatile memory device, and a first syndrome weight indicating an error level of the first data. The first data is output to a host when the first syndrome weight is a specific value. The high level decoder having a first error correction capability is selected to decode the first data, when the first syndrome weight exceeds a reference value, and the low level decoder having a second error correction capability lower than the first error correction capability is selected to decode the first data, when the first syndrome weight is the reference value or less.

20 Claims, 21 Drawing Sheets

(56) References Cited

U.S. PATENT DOCUMENTS

| | | |
|---|---|---|
| 2016/0062698 A1 | 3/2016 | Wu |
| 2018/0175882 A1 | 6/2018 | Hanham et al. |
| 2019/0065123 A1 | 2/2019 | Yen et al. |
| 2019/0097653 A1 | 3/2019 | Zhang et al. |
| 2019/0155686 A1* | 5/2019 | Kumar ................ G06F 11/1068 |
| 2020/0252079 A1* | 8/2020 | Wang ................ H03M 13/6325 |
| 2020/0301770 A1* | 9/2020 | Masakawa .......... G06F 11/3037 |

* cited by examiner

FIG. 17

| 2 Bit Edge Value | | Number |
|---|---|---|
| Edge Sign Value | Edge Magnitude Value | |
| 1 | 1 | 2 |
| 1 | 0 | 1 |
| 0 | 1 | −1 |
| 0 | 0 | −2 |

STORAGE CONTROLLER FOR CORRECTING ERROR, STORAGE DEVICE INCLUDING THE SAME, AND OPERATING METHOD THEREOF

CROSS-REFERENCE TO RELATED APPLICATION

This application claims priority under 35 U.S.C. § 119 to Korean Patent Application No. 10-2019-0164302 filed on Dec. 11, 2019, in the Korean Intellectual Property Office, the disclosure of which is incorporated by reference herein in its entirety.

BACKGROUND

1. Field

Apparatuses, devices and methods consistent with the present disclosure relate to a semiconductor memory, and more particularly, relate to a storage controller for correcting an error, a storage device including the same, and an operating method thereof.

2. Description of Related Art

A semiconductor memory supports a write operation for storing data and a read operation for reading the stored data. An error may occur while data are being written in the semiconductor memory, while data are being stored in the semiconductor memory, or when data are read from the semiconductor memory. The error may be corrected through a separate error correction device.

An error of a low level may occur in an initial scenario immediately after a semiconductor device is manufactured. An error processing device for processing the error of the low level at a high speed may be required. On the other hand, an error of a high level may occur in a later scenario after the semiconductor device is repeatedly used. An error processing device of a high error correction capability may be required to process the error of the high level. However, in the case of implementing a plurality of error processing devices to cope with the two scenarios for each of a plurality of semiconductor memories, a chip area may increase, or the throughput in a specific scenario may decrease.

SUMMARY

It is an aspect to provide a storage controller in which an error correction device selected based on an error level of data corrects an error, a storage device including the same, and an operating method thereof.

It is another aspect to provide a storage controller for correcting an error through a combination of error correction devices of a low error correction capacity like an error correction device of a high error correction capacity, a storage device including the same, and an operating method thereof.

According to an aspect of an exemplary embodiment, there is provided an operating method of a storage controller which includes a high level decoder and a low level decoder includes generating first data that is a result of decoding initial data read from a nonvolatile memory device, and a first syndrome weight indicating an error level of the first data, outputting the first data to a host when the first syndrome weight is a specific value, selecting the high level decoder having a first error correction capability to decode the first data, when the first syndrome weight exceeds a reference value, and selecting the low level decoder having a second error correction capability lower than the first error correction capability to decode the first data, when the first syndrome weight is the reference value or less.

According to another aspect of an exemplary embodiment, there is provided a storage controller comprising an error correction code (ECC) core device including a decoder connected with a nonvolatile memory device configured to store initial data, a high level decoder having a first error correction capability, and a low level decoder having a second error correction capability lower than the first error correction capability; and an ECC scheduler configured to receive a first syndrome weight from the decoder, to output a request signal for requesting decoding of first data to the high level decoder when the first syndrome weight exceeds a reference value, and to output the request signal to the low level decoder when the first syndrome weight is the reference value or less, wherein the decoder reads the initial data from the nonvolatile memory device, generates the first data that is a result of decoding the read initial data and generates a first syndrome weight indicating an error level of the first data, outputs the first data to a host when the first syndrome weight is a specific value, and outputs the first data to the high level decoder or the low level decoder that receives the request signal, when the first syndrome weight is not the specific value.

According to yet another aspect of an exemplary embodiment, there is provided a storage device comprising a first level decoder having a first error correction capability, and configured to generate first data that is a result of decoding initial data read from a nonvolatile memory device and to generate a first syndrome weight indicating an error level of the first data; a second level decoder having a second error correction capability higher than the first error correction capability; a third level decoder having a third error correction capability higher than the second error correction capability; and an ECC scheduler configured to receive the first syndrome weight, to output a request signal for requesting decoding of the first data to the third level decoder when the first syndrome weight exceeds a reference value, and to output the request signal to the second level decoder when the first syndrome weight is the reference value or less, wherein the first level decoder is configured to output the first data to a host when the first syndrome weight is a specific value and to output the first data to the second level decoder or the third level decoder that receives the request signal, when the first syndrome weight is not the specific value.

BRIEF DESCRIPTION OF THE FIGURES

The above and other aspects will become apparent by describing in detail exemplary embodiments thereof with reference to the accompanying drawings, in which:

FIG. 17 is a diagram illustrating an edge value that combined decoder memories of FIG. 16 process, according to an exemplary embodiment;

DETAILED DESCRIPTION

Below, various exemplary embodiments may be described in detail and clearly to such an extent that one of ordinary skill in the art may easily implement the various exemplary embodiments. The terms "unit", "module", etc. used in the specification may be implemented in the form of hardware, software, or a combination thereof configured to perform various functions to be described in the specification.

Figure 1:
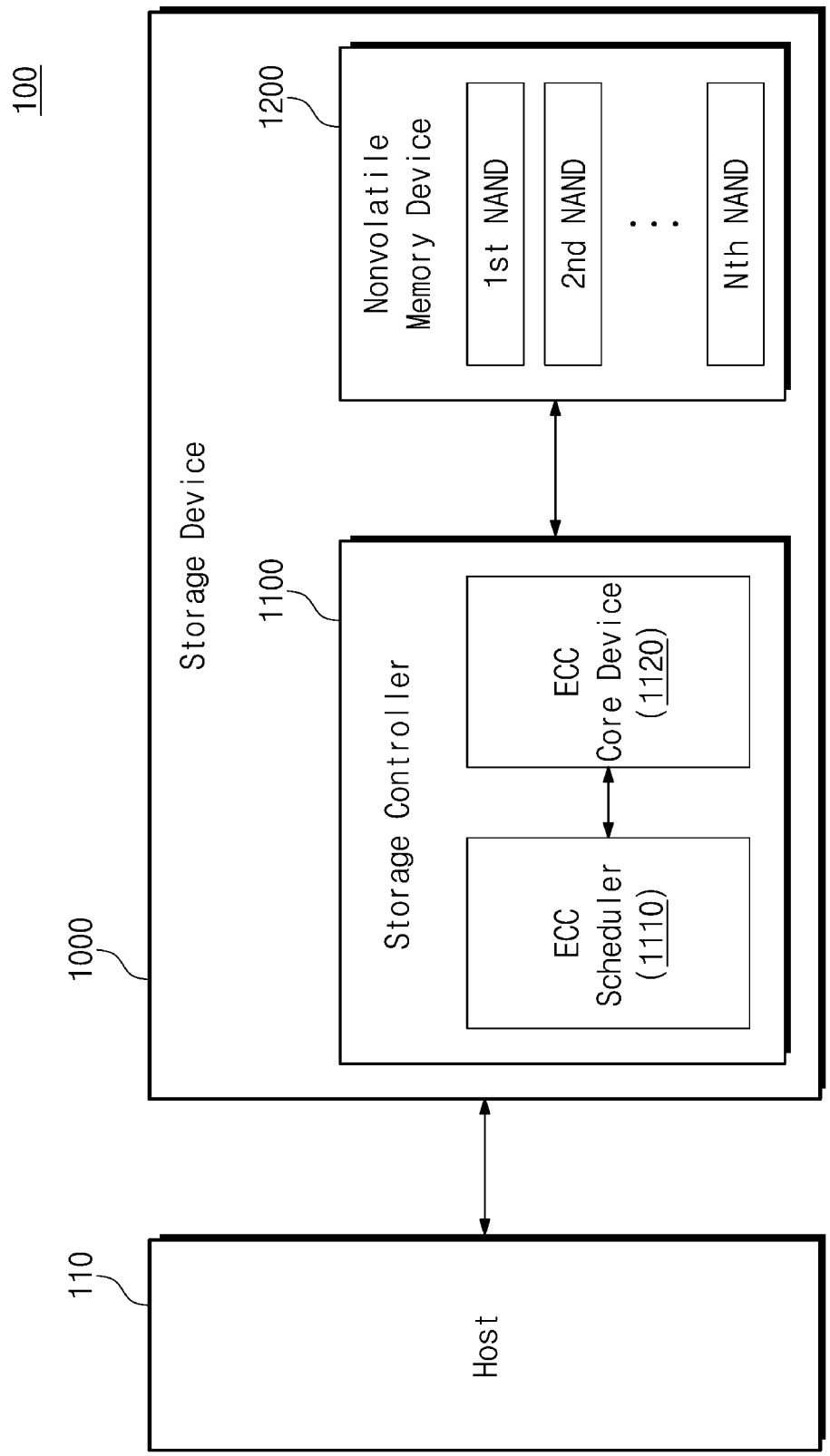
FIG. 1 is a block diagram illustrating a storage system according to an exemplary embodiment.

FIG. 1 is a block diagram illustrating a storage system according to an exemplary embodiment. Referring to FIG. 1, a storage system 100 may include a host 110 and a storage device 1000. In an exemplary embodiment, the storage system 100 may be a computing system, which is configured to process various information, such as a personal computer (PC), a notebook, a laptop, a server, a workstation, a tablet PC, a smartphone, a digital camera, or a black box.

The host 110 may control overall operations of the storage system 100. For example, the host 110 may store data to the storage device 1000 or may read data stored in the storage device 1000. Under control of the host 110, the storage device 1000 may store data or may provide the stored data to the host 110. The storage device 1000 may include a storage controller 1100 and a nonvolatile memory device 1200.

The storage controller 1100 may store data to the nonvolatile memory device 1200 or may read data stored in the nonvolatile memory device 1200. The nonvolatile memory device 1200 may operate under control of the storage controller 1100.

In an exemplary embodiment, the nonvolatile memory device 1200 may include, for example, a plurality of NAND flash memories, e.g., first to N-th NAND flash memories, each storing data. That is, the storage device 1000 may be a storage device having a plurality of NAND channels. However, exemplary embodiments are not limited thereto. For example, the nonvolatile memory device 1200 may be one of storage devices, which retain data stored therein even when a power is turned off, such as a phase-change random access memory (PRAM), a magnetic RAM (MRAM), a resistive RAM (RRAM), and a ferroelectric RAM (FRAM).

The storage controller 1100 may include an ECC scheduler 1110 and an ECC core device 1120. The ECC scheduler 1110 may select an error processing device that will correct an error of data read from the nonvolatile memory device 1200 depending on an error level of the read data. For example, the error processing device may be a decoder that corrects an error of data read from the nonvolatile memory device 1200. The error level may denote how many error bits, the number of which does not satisfy an error detection rule, are present in the read data.

The ECC core device 1120 may include a plurality of error processing devices having different error correction capacities. An error correction capacity may denote a number of error bits, which an error processing device is capable of correcting, of read data.

In an exemplary embodiment, an error processing device included in the ECC core device 1120 may have an error correction capacity of a given level. For example, in the case where an error of data read from the nonvolatile memory device 1200 exceeds an error correction capacity of an error processing device, the error of the data read from the nonvolatile memory device 1200 may not be corrected by that error processing device.

In an exemplary embodiment, the ECC core device 1120 may include a high level decoder and a low level decoder. For example, the high level decoder may be an error processing device that is characterized in that an error correction capability is high, an error correction speed is slow, and the size of hardware is large. The low level decoder may be an error processing device that is characterized in that an error correction speed is high, the size of hardware is small, and an error correction capability is low.

In an exemplary embodiment, an error that mainly occurs in an initial scenario applied immediately after a semiconductor memory is manufactured may be an error of a low level. On the other hand, an error that mainly occurs in a later scenario applied after the semiconductor memory is repeatedly used may be an error of a high level.

In the related art, a low level decoder and a high level decoder are allocated to each NAND flash memory of plural NAND flash memories included in a nonvolatile memory device. This configuration causes an increase of a chip area of a storage device.

According to an exemplary embodiment, the storage device 1000 may have a full-shared structure in which each of error processing devices included in the ECC core device 1120 accesses all the first to N-th NAND flash memories included in the nonvolatile memory device 1200. As the first to N-th NAND flash memories share an error processing device, some error processing devices may be omitted as compared with the related art. Accordingly, a chip area of the storage device 1000 may be decreased.

Figure 2:
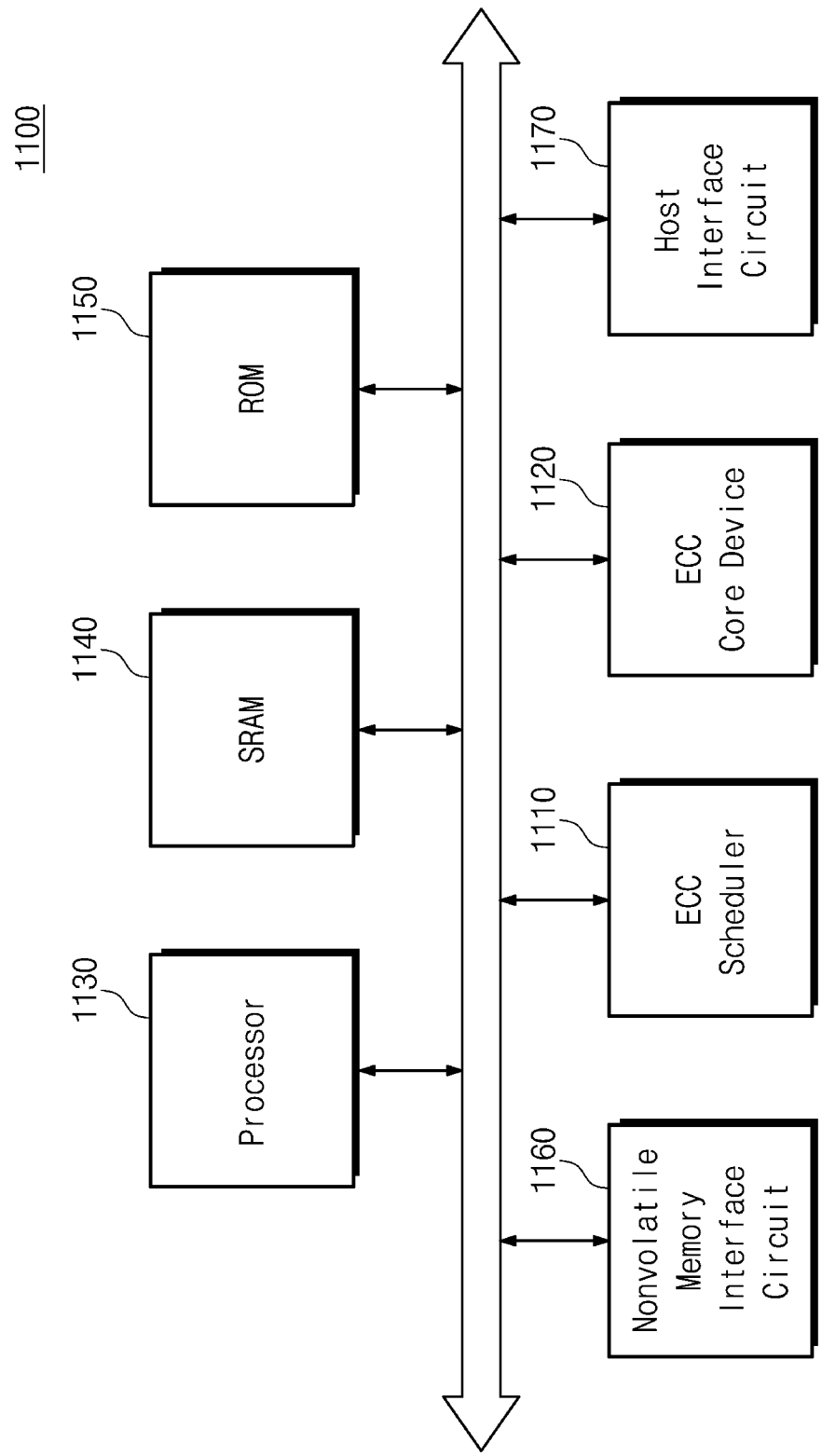
FIG. 2 is a block diagram illustrating a storage controller of FIG. 1, according to an exemplary embodiment.

FIG. 2 is a block diagram illustrating a storage controller 1100 of FIG. 1, according to an exemplary embodiment. Referring to FIGS. 1 and 2, the storage controller 1100 may include the ECC scheduler 1110, the ECC core device 1120, a processor 1130, a static RAM (SRAM) 1140, a read only memory (ROM) 1150, a nonvolatile memory interface circuit 1160, and a host interface circuit 1170.

The ECC scheduler 1110 may select an error processing device, which will correct an error, from among error processing devices included in the ECC core device 1120. The ECC core device 1120 may include the plurality of error processing devices. A configuration of the error processing devices included in the ECC core device 1120 and a method in which the ECC scheduler 1110 selects an error processing device will be more fully described below with reference to drawings.

The processor 1130 may control overall operations of the storage controller 1100. The processor 1130 may include a central processing unit (CPU), a microprocessor, or an application processor, etc. The SRAM 1140 may be used as a buffer memory, a cache memory, or a working memory of the storage controller 1100. The ROM 1150 may store a variety of information, which is necessary for the storage controller 1100 to operate, in the form of firmware.

In an exemplary embodiment, the ECC scheduler 1110 and the ECC core device 1120 may be implemented in the form of software, hardware, or a combination thereof. For example, the ROM 1150 may store an operating method of the ECC scheduler 1110. The SRAM 1140 may store data that an error processing device included in the ECC core device 1120 outputs. The processor 1130 may output a command for controlling the ECC scheduler 1110 and the ECC core device 1120.

The storage controller 1100 may communicate with the nonvolatile memory device 1200 through the nonvolatile memory interface circuit 1160. In an exemplary embodiment, the nonvolatile memory interface circuit 1160 may be implemented based on a NAND interface.

The storage controller 1100 may communicate with the host 110 through the host interface circuit 1170. In an exemplary embodiment, the host interface circuit 1170 may be implemented based on at least one of various interfaces such as a SATA (Serial ATA) interface, a PCIe (Peripheral Component Interconnect Express) interface, a SAS (Serial Attached SCSI) interface, an NVMe (Nonvolatile Memory express) interface, and an UFS (Universal Flash Storage) interface, etc.

Figure 3:
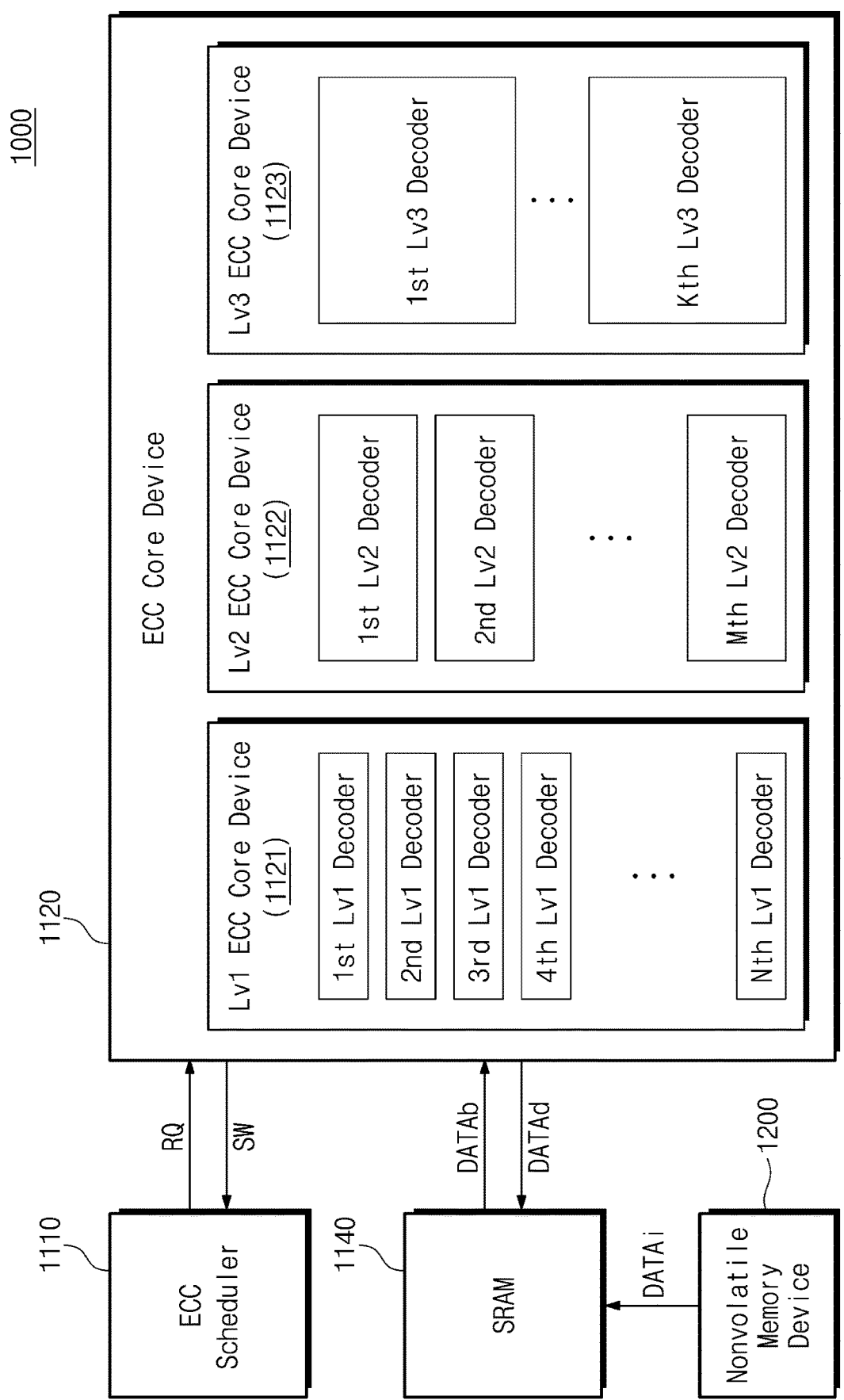
FIG. 3 is a block diagram illustrating a storage device of FIG. 1, according to an exemplary embodiment.

FIG. 3 is a block diagram illustrating a storage device 1000 of FIG. 1, according to an exemplary embodiment. Referring to FIGS. 1 and 3, the ECC scheduler 1110, the ECC core device 1120, the SRAM 1140, and the nonvolatile memory device 1200 are exemplified.

The ECC scheduler 1110 may select a decoder in the ECC core device 1120 and may output a request signal RQ for requesting decoding to the selected decoder. The ECC scheduler 1110 may receive a syndrome weight SW from the ECC core device 1120. The syndrome weight SW may indicate an error level of decoded data DATAd that is output from the selected decoder of the ECC core device 1120 that has performed the decoding on the decoded data DATAd.

In an exemplary embodiment, the ECC scheduler 1110 may output the request signal RQ requesting decoding of initial data DATAi. The initial data DATAi may be data that is stored in the nonvolatile memory device 1200 and has not been decoded. In some exemplary embodiments, a first level decoder included in a first level (Lv1) ECC core device 1121 may be selected as a decoder, which will perform decoding of the initial data DATAi, regardless of the syndrome weight SW.

In an exemplary embodiment, the ECC scheduler 1110 may select a decoder having an error correction capacity corresponding to an error level of the decoded data DATAd based on the received syndrome weight SW. For example, the ECC scheduler 1110 may receive the syndrome weight SW indicating an error level of a second level. The ECC scheduler 1110 may select a second level decoder included in a second level (Lv2) ECC core device 1122 and may output the request signal RQ for requesting additional decoding of the decoded data DATAd to the selected second level decoder.

The ECC core device 1120 may receive the request signal RQ from the ECC scheduler 1110. The ECC core device 1120 may read buffer data DATAb from the SRAM 1140 based on the received request signal RQ. The ECC core device 1120 may output the decoded data DATAd, which are generated by decoding the read buffer data DATAb, to the SRAM 1140. The ECC core device 1120 may output the syndrome weight SW indicating an error level of the decoded data DATAd to the ECC scheduler 1110.

In an exemplary embodiment, the ECC core device 1120 may include the first level (Lv1) ECC core device 1121, the second level (Lv2) ECC core device 1122, and a third level (Lv3) ECC core device 1123. The first level ECC core device 1121 may include "N" first level decoders. The second level ECC core device 1122 may include "M" second level decoders. A third level ECC core device 1123 may include "K" third level decoders. Here, "N" may be more than "M", and "M" may be more than "K".

A first level decoder may be characterized in that a size is smaller, a processing speed is higher, and an error correction capability is lower, as compared to those of a second level decoder. The second level decoder may be characterized in that a size is smaller, a processing speed is higher, and an error correction capability is lower, as compared to those of a third level decoder. In other words, a first level decoder has a smallest size, a highest processing speed, and a lowest error correction capability among the first, second, and third level decoders, and a third level decoder has a largest size, a lowest processing speed, and a highest error correction capability among the first, second, and third level decoders.

In an exemplary embodiment, unlike the example illustrated in FIG. 3, the ECC core device 1120 may directly receive the initial data DATAi from the nonvolatile memory device 1200. The ECC core device 1120 may output the decoded data DATAd, which are generated by decoding the initial data DATAi, to the SRAM 1140.

The nonvolatile memory device 1200 may store the initial data DATAi. The initial data DATAi may include a portion of user data such as music, an image, and a video. The nonvolatile memory device 1200 may output the initial data DATAi to the SRAM 1140 under control of the host 110.

The SRAM 1140 may receive the initial data DATAi from the nonvolatile memory device 1200. The SRAM 1140 may store the received initial data DATAi as the buffer data DATAb. The SRAM 1140 may output the buffer data DATAb to the ECC core device 1120. The SRAM 1140 may receive the decoded data DATAd from the ECC core device 1120. The SRAM 1140 may store the received decoded data DATAd as the buffer data DATAb. That is, the SRAM 1140 may operate as a buffer memory.

Figure 4:
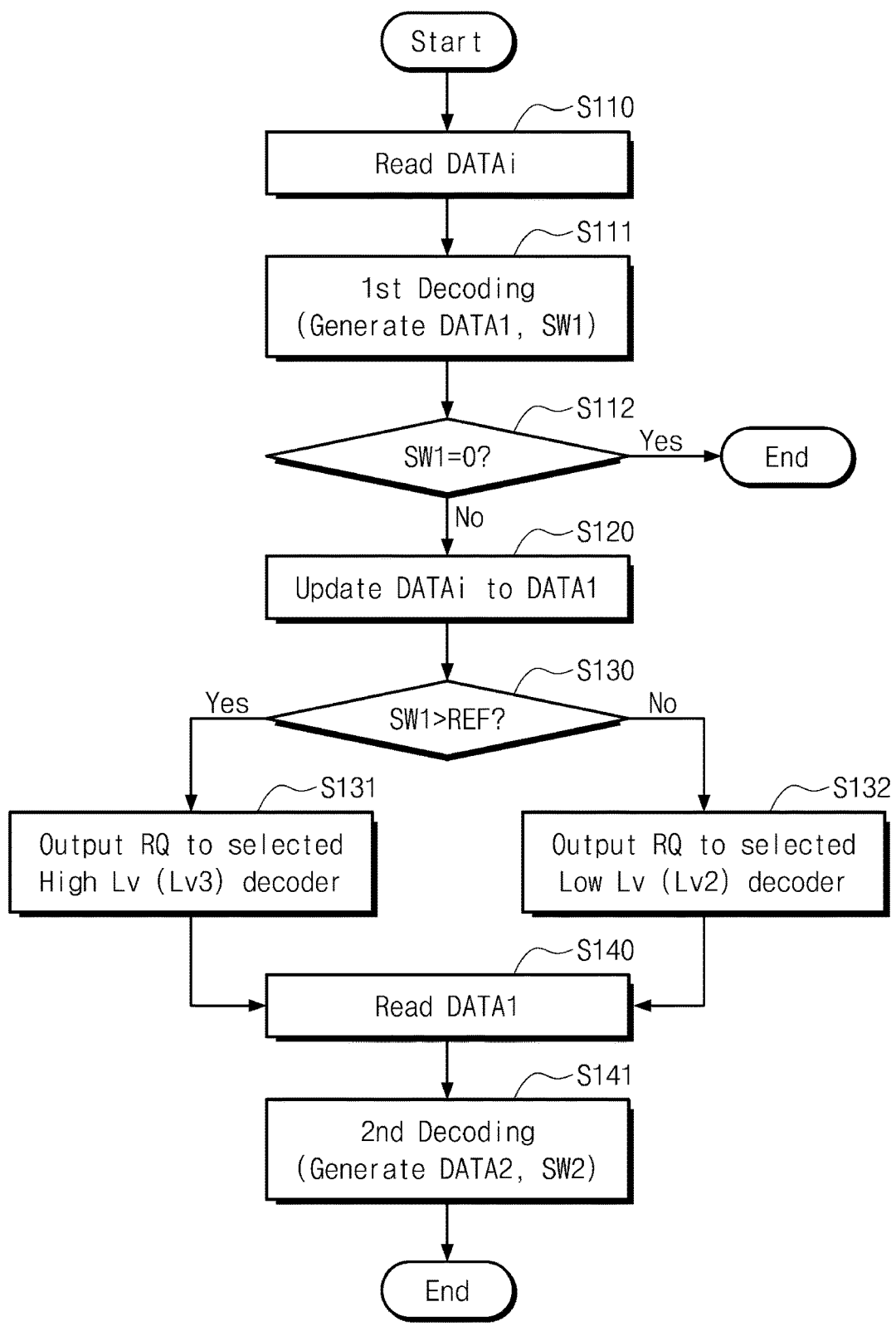
FIG. 4 is a flowchart illustrating an operating method of a storage controller of FIG. 1, according to an exemplary embodiment.

FIG. 4 is a flowchart illustrating an operating method of a storage controller of FIG. 1. Referring to FIGS. 1 and 4, an operating method of a storage device according to an exemplary embodiment is exemplified.

In operation S110, the storage controller 1100 may read the initial data DATAi stored in the nonvolatile memory device 1200. The initial data DATAi may be data that are generated by encoding a portion of user data (e.g., music, an image, or a video) based on a parity check bit so as to have an error detection rule for detecting an error.

In an exemplary embodiment, the storage controller 1100 may generate an initial syndrome weight SWi indicating an error level of the initial data DATAi based on the read initial data DATAi. The storage controller 1100 may determine a reference value REF for selecting a decoder corresponding to an error level, based on the initial syndrome weight SWi. Alternatively, the reference value REF may be a value that the user inputs before decoding.

In operation S111, the storage controller 1100 may perform a first decoding. For example, the storage controller 1100 may decode the initial data DATAi read from the nonvolatile memory device 1200. The storage controller 1100 may generate first data DATA1 and a first syndrome weight SW1. The first data DATA1 may be data that are generated by decoding the initial data DATAi. The first syndrome weight SW1 may indicate an error level of the first data DATA1.

In operation S112, whether an error is present in the first data DATA1 may be determined by determining whether the first syndrome weight SW1 is a specific value. For example, whether a value of the first syndrome weight SW1 is "0" may be determined after operation S111. That the value of the first syndrome weight SW1 is "0" may mean that an error is absent from the first data DATA1. In this case, the storage controller 1100 may output the first data DATA1 to the host 110 and may terminate an operation. When the value of the first syndrome weight SW1 is not "0", the storage controller 1100 may perform operation S120.

In operation S120, the storage controller 1100 may update the initial data DATAi to the first data DATA1. For example, the storage controller 1100 may still have stored therein the initial data DATAi read in operation S110, and thus the storage controller 1100 may overwrite the first data DATA1 over the stored initial data DATAi.

In operation S130, the storage controller 1100 may compare the first syndrome weight SW1 and the reference value REF. When the first syndrome weight SW1 exceeds a reference value REF, operation S131 may be performed. When the first syndrome weight SW1 is the reference value REF or less, operation S132 may be performed.

In operation S131, the storage controller 1100 may select a third level decoder. The storage controller 1100 may output the request signal RQ for requesting the selected third level decoder to decode the first data DATA1. In this case, the third level decoder may be an error processing device of a relatively higher error correction capability that the second level decoder.

In operation S132, the storage controller 1100 may select a second level decoder. The storage controller 1100 may output the request signal RQ for requesting the selected second level decoder to decode the first data DATA1. In this case, the second level decoder may be an error processing device of a relatively lower error correction capability than the third level decoder.

In operation S140, a decoder included in the storage controller 1100 may read the first data DATA1 stored in the storage controller 1100 in response to the request signal RQ. In this case, the decoder may be the third level decoder receiving the request signal RQ in operation S131 or the second level decoder receiving the request signal RQ in operation S132.

In operation S141, the storage controller 1100 may decode the first data DATA1 through the decoder receiving the request signal RQ. The storage controller 1100 may generate second data DATA2 and a second syndrome weight SW2. The second data DATA2 may be data that are generated by decoding the first data DATA1. The second syndrome weight SW2 may indicate an error level of the second data DATA2.

Figure 5A:
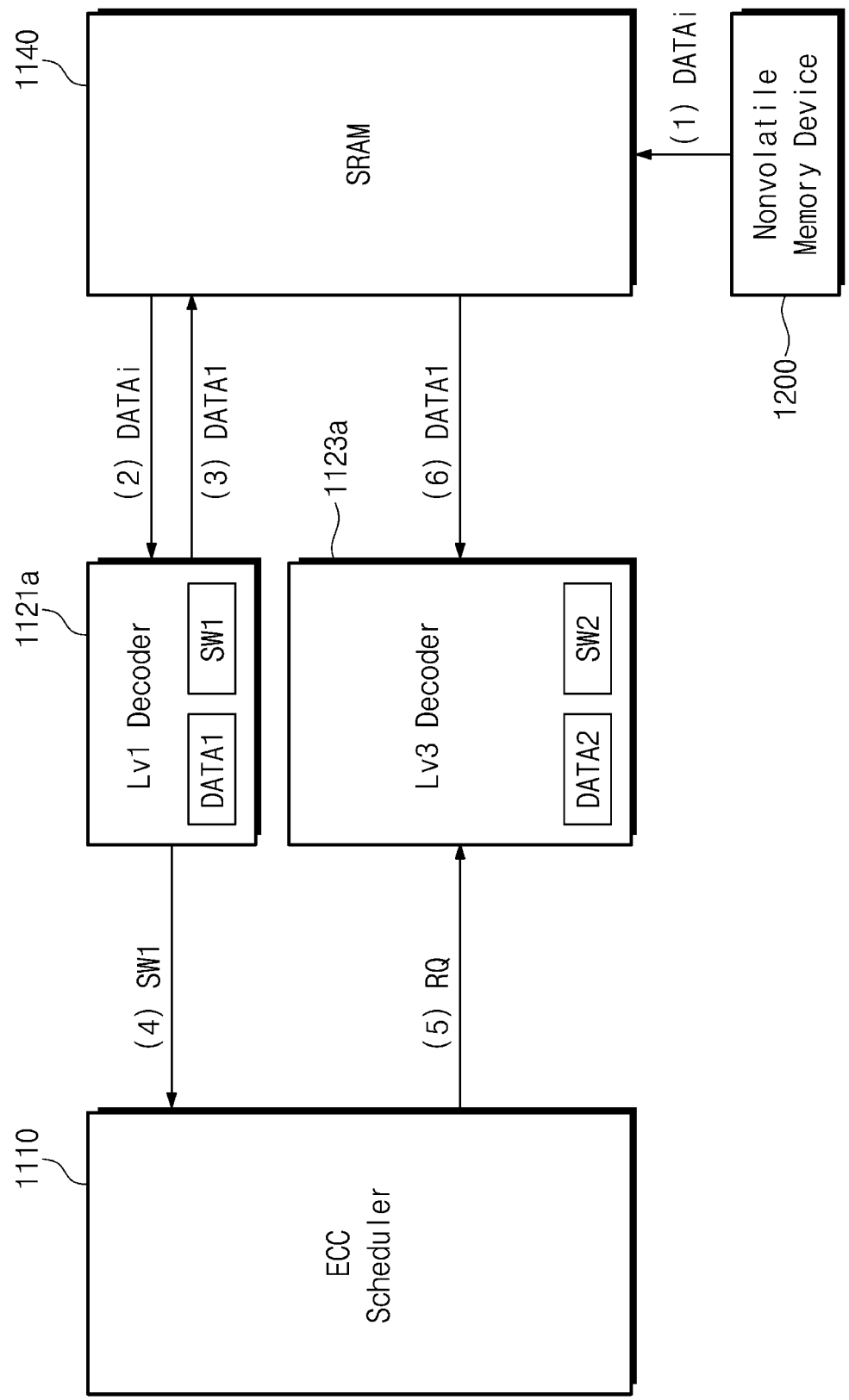
FIG. 5A is a block diagram illustrating a storage device in which an operating method of FIG. 4 is implemented, according to an exemplary embodiment.

FIG. 5A is a block diagram illustrating a storage device in which an operating method of FIG. 4 is implemented, according to an exemplary embodiment. A storage device that selects a third level decoder to decode the first data DATA1 when the first syndrome weight SW1 exceeds a reference value is illustrated in FIG. 5A as an example.

The nonvolatile memory device 1200 may output the initial data DATAi to the SRAM 1140 in response to a read command received from a host. By contrast, in some exemplary embodiments, the nonvolatile memory device 1200 may directly output the initial data DATAi to a first level decoder 1121a.

In some exemplary embodiments, the storage device may further include an error estimate circuit (not illustrated) that reads the initial data DATAi and generates the initial syndrome weight SW1 indicating an error level of the initial data DATAi. The error estimate circuit may determine the reference value REF based on the initial syndrome weight SW1 and may output the decided reference value REF to the ECC scheduler 1110.

The SRAM 1140 may receive the initial data DATAi from the nonvolatile memory device 1200 at (1). The SRAM 1140 may store the received initial data DATAi. The SRAM 1140 may output the initial data DATAi to the first level decoder 1121a at (2). That is, the SRAM 1140 may be a buffer memory that stores temporary data to be used for decoding of a storage controller.

The first level decoder 1121a may read the initial data DATAi from the SRAM 1140. The first level decoder 1121a may generate the first data DATA1 and the first syndrome weight SW1 based on the read initial data DATAi. The first level decoder 1121a may output the first data DATA1 to the SRAM 1140 at (3). The first level decoder 1121a may output the first syndrome weight SW1 to the ECC scheduler 1110 at (4). When a value of the first syndrome weight SW1 is a specific value, the first level decoder 1121a may output the first data DATA1 to a host and may terminate an operation. The first level decoder 1121a may be one of first level decoders included in the first level (Lv1) ECC core device 1121 of FIG. 3.

The ECC scheduler 1110 may receive the first syndrome weight SW1 from the first level decoder 1121a at (4). The ECC scheduler 1110 may compare the first syndrome weight SW1 and the reference value REF. When the first syndrome weight SW1 exceeds the reference value REF, the ECC scheduler 1110 may select a third level decoder. The ECC scheduler 1110 may output the request signal RQ for requesting the selected third level decoder to decode the first data DATA1 at (5).

A third level decoder 1123a may receive the request signal RQ from the ECC scheduler 1110 at (5). The third level decoder 1123a may read the first data DATA1 from the SRAM 1140 based on the received request signal RQ at (6). The third level decoder 1123*a* may generate the second data DATA2 and the second syndrome weight SW2 based on the read first data DATA1.

Figure 5B:
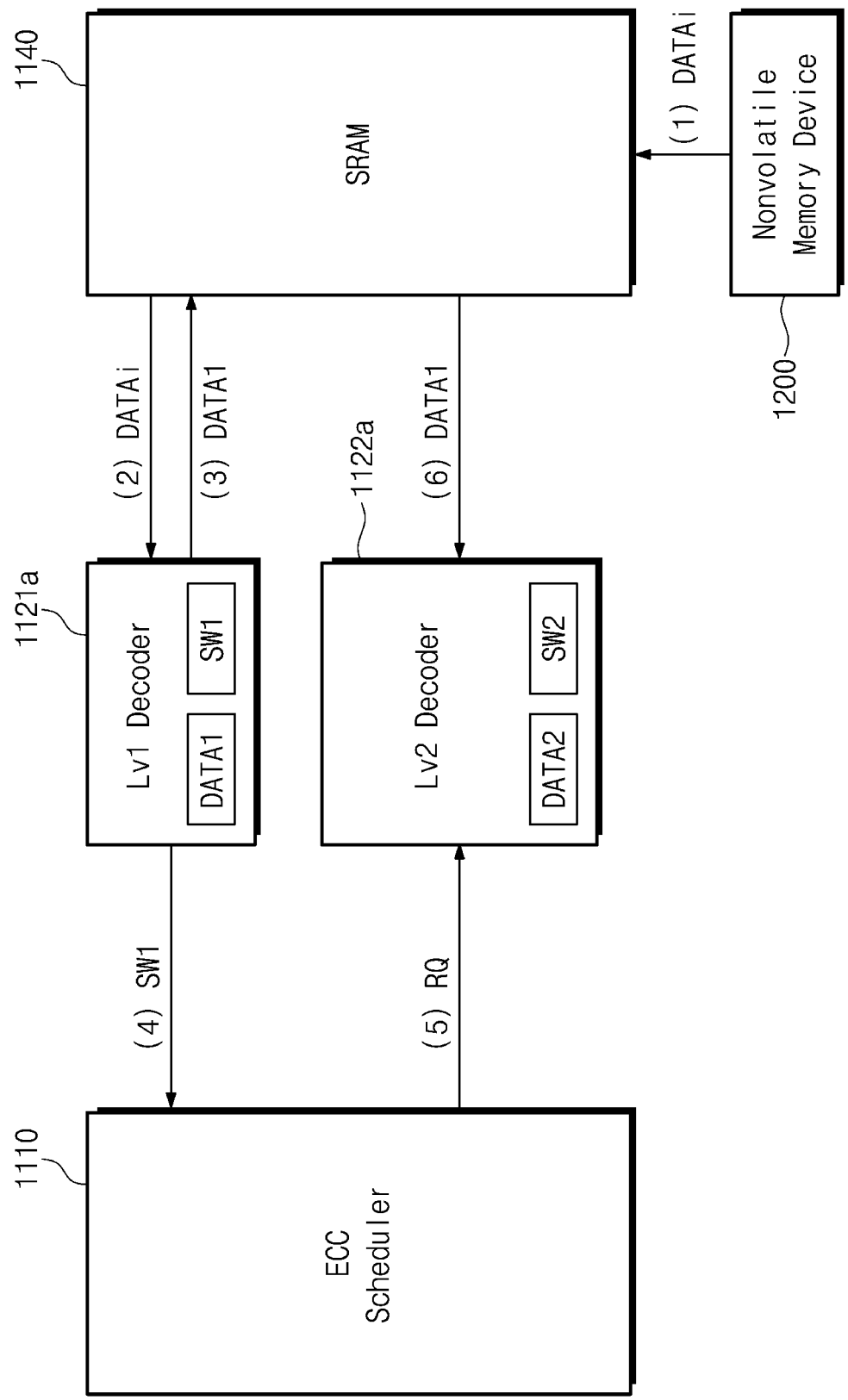
FIG. 5B is a block diagram illustrating a storage device in which an operating method of FIG. 4 is implemented, according to an exemplary embodiment.

FIG. 5B is a block diagram illustrating a storage device in which an operating method of FIG. 4 is implemented, according to an exemplary embodiment. A storage device that selects a second level decoder to decode the first data DATA1 when the first syndrome weight SW1 is a reference value or less is illustrated in FIG. 5B as an example. Characteristics of the nonvolatile memory device 1200, the SRAM 1140, and the first level decoder 1121*a* are similar to those described with reference to FIG. 5A, and thus, repeated description will be omitted for conciseness and to avoid redundancy.

The ECC scheduler 1110 may receive the first syndrome weight SW1 from the first level decoder 1121*a* at (4). The ECC scheduler 1110 may compare the first syndrome weight SW1 and the reference value REF. When the first syndrome weight SW1 is the reference value REF or less, the ECC scheduler 1110 may select a second level decoder. The ECC scheduler 1110 may output the request signal RQ for requesting the selected second level decoder to decode the first data DATA1 at (5).

The second level decoder 1122*a* may be an error processing device having a lower error correction capability than the third level decoder 1123*a* of FIG. 5A. The second level decoder 1122*a* may be one of second level decoders included in the second level (Lv2) ECC core device 1122 of FIG. 3.

The second level decoder 1122*a* may receive the request signal RQ from the ECC scheduler 1110 at (5). The second level decoder 1122*a* may read the first data DATA1 from the SRAM 1140 based on the received request signal RQ. The second level decoder 1122*a* may generate the second data DATA2 and the second syndrome weight SW2 based on the read first data DATA1. That is, the second level decoder 1122*a* may be an error processing device that corrects an error of the first data DATA1, of which an error level is a reference value or less.

Figure 6:
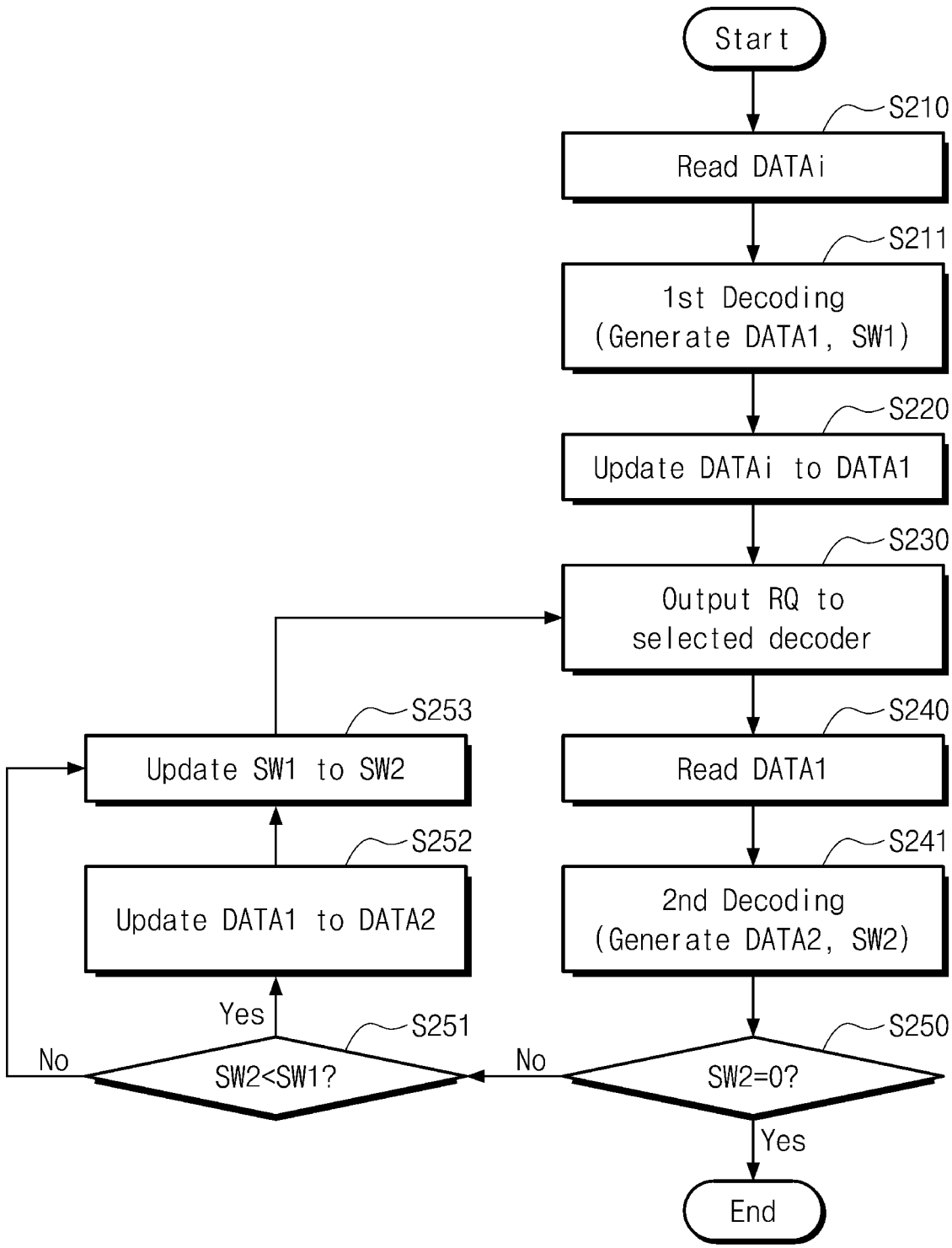
FIG. 6 is a flowchart illustrating an operating method of a storage controller of FIG. 1, according to an exemplary embodiment.

FIG. 6 is a flowchart illustrating an operating method of a storage controller of FIG. 1, according to an exemplary embodiment. Referring to FIGS. 1 and 6, an operating method of a storage device according to an exemplary embodiment is exemplified. Operation S210, operation S211, operation S220, operation S240, and operation S241 of FIG. 6 may be similar to operation S110, operation S111, operation S120, operation S140, and operation S141 of FIG. 4, and thus, repeated description will be omitted for conciseness and to avoid redundancy.

In operation S230, the storage controller 1100 may compare the first syndrome weight SW1 and the reference value REF. When the first syndrome weight SW1 exceeds the reference value, the storage controller 1100 may output the request signal RQ for requesting decoding of the first data DATA1 to the third level decoder. When the first syndrome weight SW1 is the reference value or less, the storage controller 1100 may output the request signal RQ for requesting decoding of the first data DATA1 to the second level decoder. That is, in operation S230, the storage controller 1100 may operate to be similar to operation S130, operation S131, and operation S132 of FIG. 4.

In operation S250, the storage controller 1100 may determine whether an error is present in the second data DATA2, by determining whether a value of the second syndrome weight SW2 is a specific value. For example, the storage controller 1100 may determine whether a value of the second syndrome weight SW2 is "0". When the value of the second syndrome weight SW2 is "0", an error may be absent from the second data DATA2. When the value of the second syndrome weight SW2 is "0", the storage controller 1100 may output the second data DATA2 to the host 110 and may terminate an operation. When the value of the second syndrome weight SW2 is not "0", the storage controller 1100 may perform operation S251.

In operation S251, the storage controller 1100 may compare the second syndrome weight SW2 and the first syndrome weight SW1. When the second syndrome weight SW2 is smaller than the first syndrome weight SW1, operation S252 may be performed. When the second syndrome weight SW2 is greater than or equal to the first syndrome weight SW1, operation S253 may be performed.

In operation S252, the storage controller 1100 may update the first data DATA1 to the second data DATA2. That is, the storage controller 1100 may store the second data DATA2 of a lower error level than the first data DATA1.

In operation S253, the storage controller 1100 may update the first syndrome weight SW1 to the second syndrome weight SW2. Operation S253 may be performed regardless of a determination result in operation S251. Operation S230 in which a decoder is selected and decoding is requested may be further performed after operation S253. That is, the operating method of the storage controller 1100 may further include selecting a decoder for additional decoding based on a result of the decoding performed in operation S241.

Figure 7:
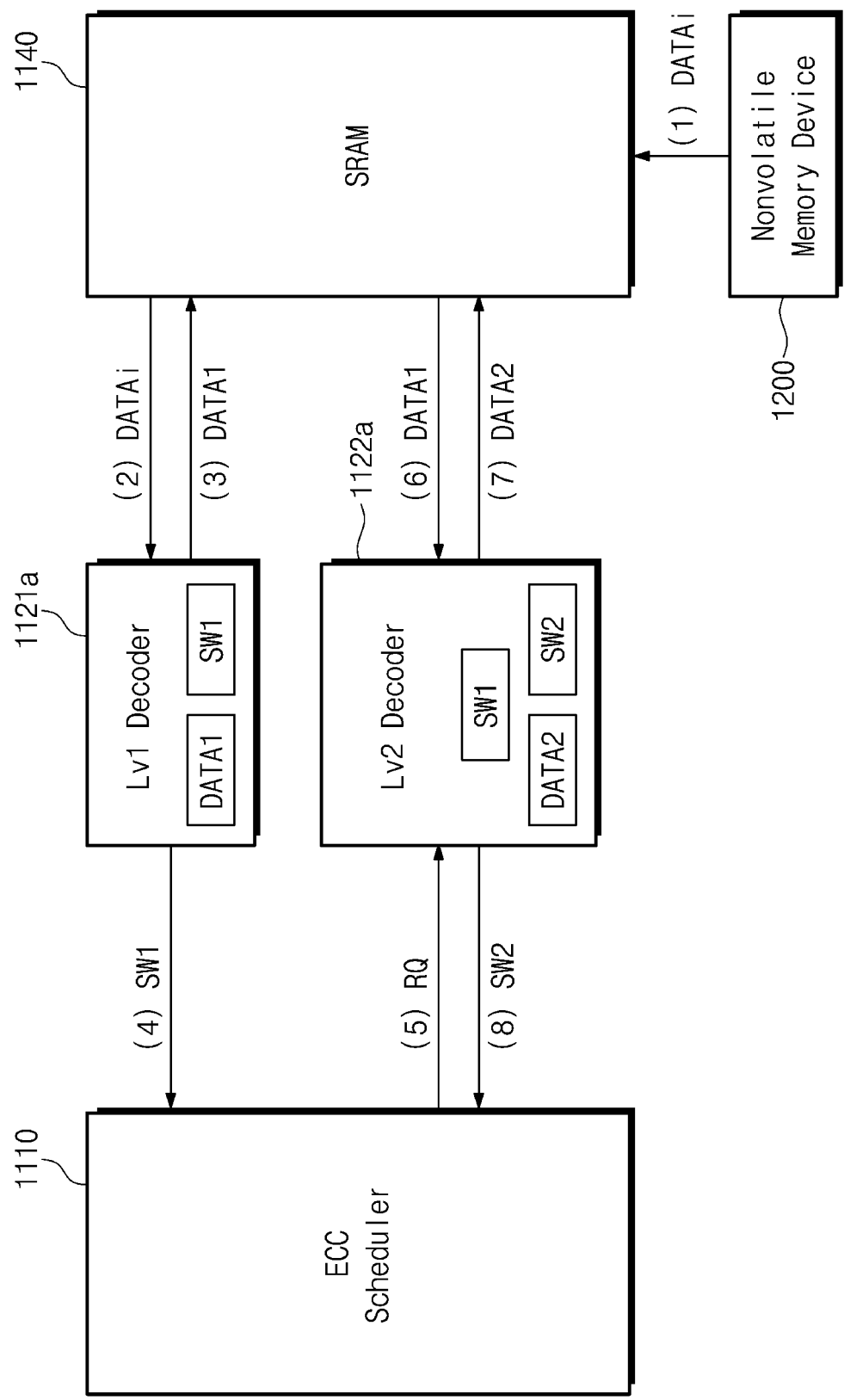
FIG. 7 is a block diagram illustrating a storage device in which an operating method of FIG. 6 is implemented, according to an exemplary embodiment.

FIG. 7 is a block diagram illustrating a storage device in which an operating method of FIG. 6 is implemented, according to an exemplary embodiment. A storage device that stores data, which have a lower error level, from among the first data DATA1 and the second data DATA2 generated by decoding the first data DATA1 is illustrated in FIG. 7 as an example. Characteristics of the nonvolatile memory device 1200 and the first level decoder 1121*a* are similar to those described with reference to FIG. 5A, and thus, repeated description will be omitted for conciseness and to avoid redundancy.

The second level decoder 1122*a* may receive the request signal RQ from the ECC scheduler 1110 at (5). The second level decoder 1122*a* may read the first data DATA1 stored in the SRAM 1140 based on the request signal RQ at (6). The second level decoder 1122*a* may calculate the first syndrome weight SW1 indicating an error level of the first data DATA1. The second level decoder 1122*a* may generate the second data DATA2 being a result of decoding the first data DATA1, and may generate the second syndrome weight SW2 indicating an error level of the second data DATA2.

The second level decoder 1122*a* may compare the calculated first syndrome weight SW1 and the second syndrome weight SW2. When the second syndrome weight SW2 is smaller than the calculated first syndrome weight SW1, the second level decoder 1122*a* may output the second data DATA2 to the SRAM 1140 at (7). In this case, the first data DATA1 stored in the SRAM 1140 may be updated to the second data DATA2.

The second level decoder 1122*a* may output the second syndrome weight SW2 to the ECC scheduler 1110 at (8). The ECC scheduler 1110 may select a decoder for additional decoding based on the second syndrome weight SW2 thus received. The ECC scheduler 1110 may output an additional request signal for requesting additional decoding to the selected decoder.

Figure 8A:
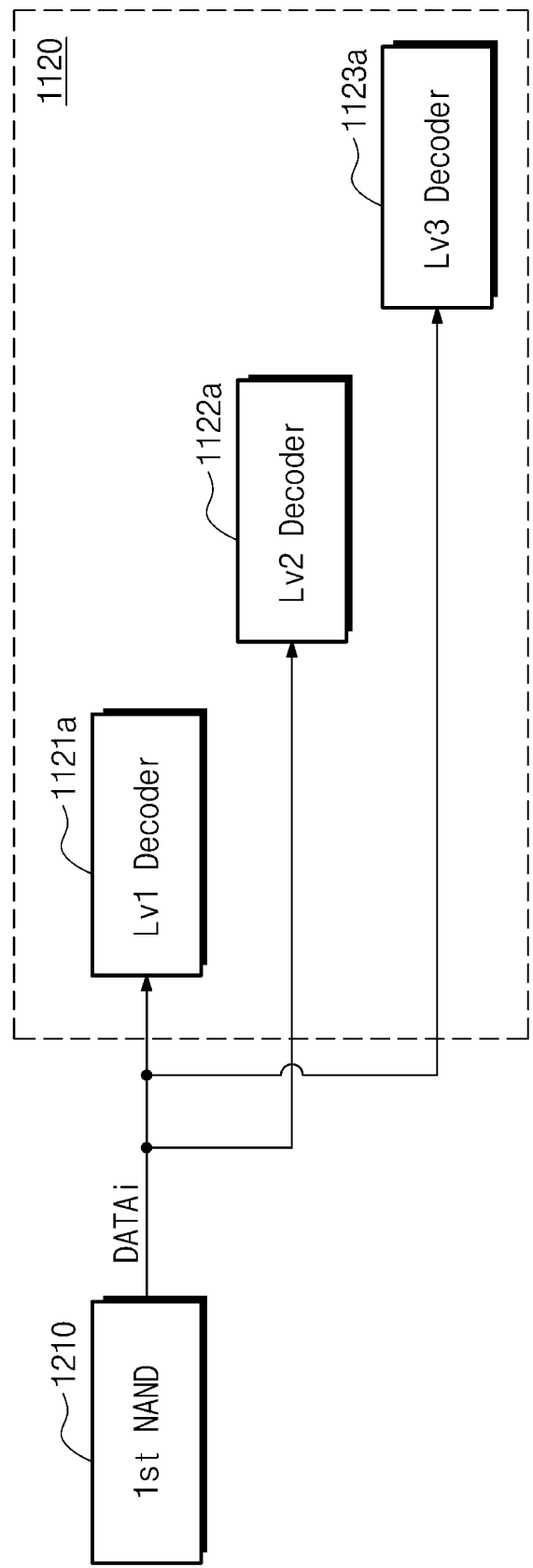
FIG. 8A is a block diagram illustrating a data flow in a storage device, according to the related art.

FIG. 8A is a block diagram illustrating a data flow in a storage device, according to the related art. A data flow in a storage device is illustrated in FIG. 8A as an example. A first NAND flash memory 1210 may be one of the first to N-th NAND flash memories included in the nonvolatile memory device 1200 of FIG. 1. The first NAND flash memory 1210 may store the initial data DATAi. The first NAND flash memory 1210 may output the initial data DATAi depending on a read command from a host.

The ECC core device 1120 may be connected with the first NAND flash memory 1210. The ECC core device 1120 may include the first level (Lv1), second level (Lv2), and third level (Lv3) decoders 1121a, 1122a, and 1123a. An error correction capability of the third level decoder 1123a may be higher than an error correction capability of the second level decoder 1122a. An error correction capability of the second level decoder 1122a may be higher than an error correction capability of the first level decoder 1121a. The ECC core device 1120 may decode the initial data DATAi received from the first NAND flash memory 1210.

In a related art storage device, the plurality of decoders 1121a to 1123a having different error correction capacities may be allocated to each of NAND flash memories included in a nonvolatile memory device. In this related art case, the first level decoder 1121a may be a decoder that is not connected with a NAND flash memory (e.g., a second NAND flash memory) different from the first NAND flash memory 1210. That is, the related art storage device includes many unnecessary decoders, thereby causing an increase of the whole chip size.

Figure 8B:
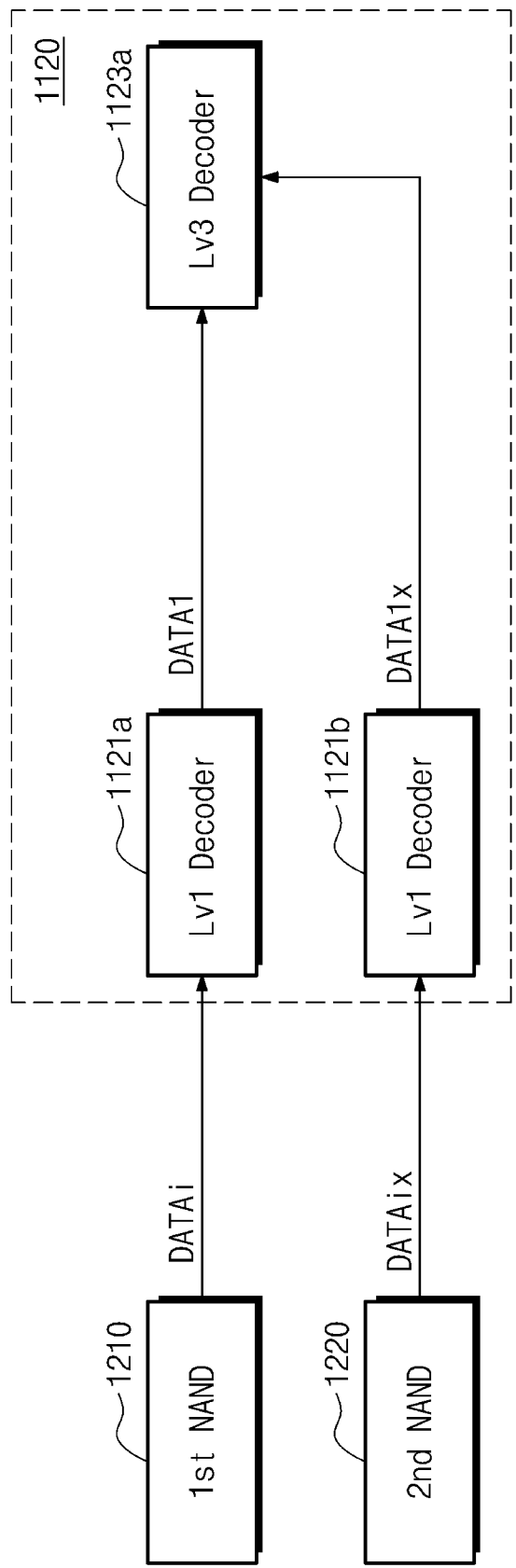
FIG. 8B is a block diagram illustrating a data flow in a storage device according to an operating method of FIG. 6, according to an exemplary embodiment.

FIG. 8B is a block diagram illustrating a data flow in a storage device according to an operating method of FIG. 6, according to an exemplary embodiment. A data flow in a storage device according to an operating method of FIG. 6 is illustrated in FIG. 8B as an example.

The first NAND flash memory 1210 may output the initial data DATAi. The ECC core device 1120 may include the first level decoder 1121a and the third level decoder 1123a. The first level decoder 1121a may receive the initial data DATAi. The first level decoder 1121a may output the first data DATA1 being a result of decoding the received initial data DATAi. The third level decoder 1123a may receive the first data DATA1. The third level decoder 1123a may decode the received first data DATA1.

In this case according to an exemplary embodiment, each of decoders included in the ECC core device 1120 may be connected with a plurality of NAND flash memories. For example, the third level decoder 1123a may further decode DATA1x output from a first level decoder 1121b. The first level decoder 1121b may decode data DATAix data output from a second NAND flash memory 1220 different from the first NAND flash memory 1210.

As described above, according to an exemplary embodiment, NAND flash memories may share a decoder. Also, the decoder may receive data decoded by another decoder and may further decode the received data. As such, as unnecessary decoders are omitted and data decoded by another decoder are utilized, a storage device with improved throughput may be provided.

Figure 9:
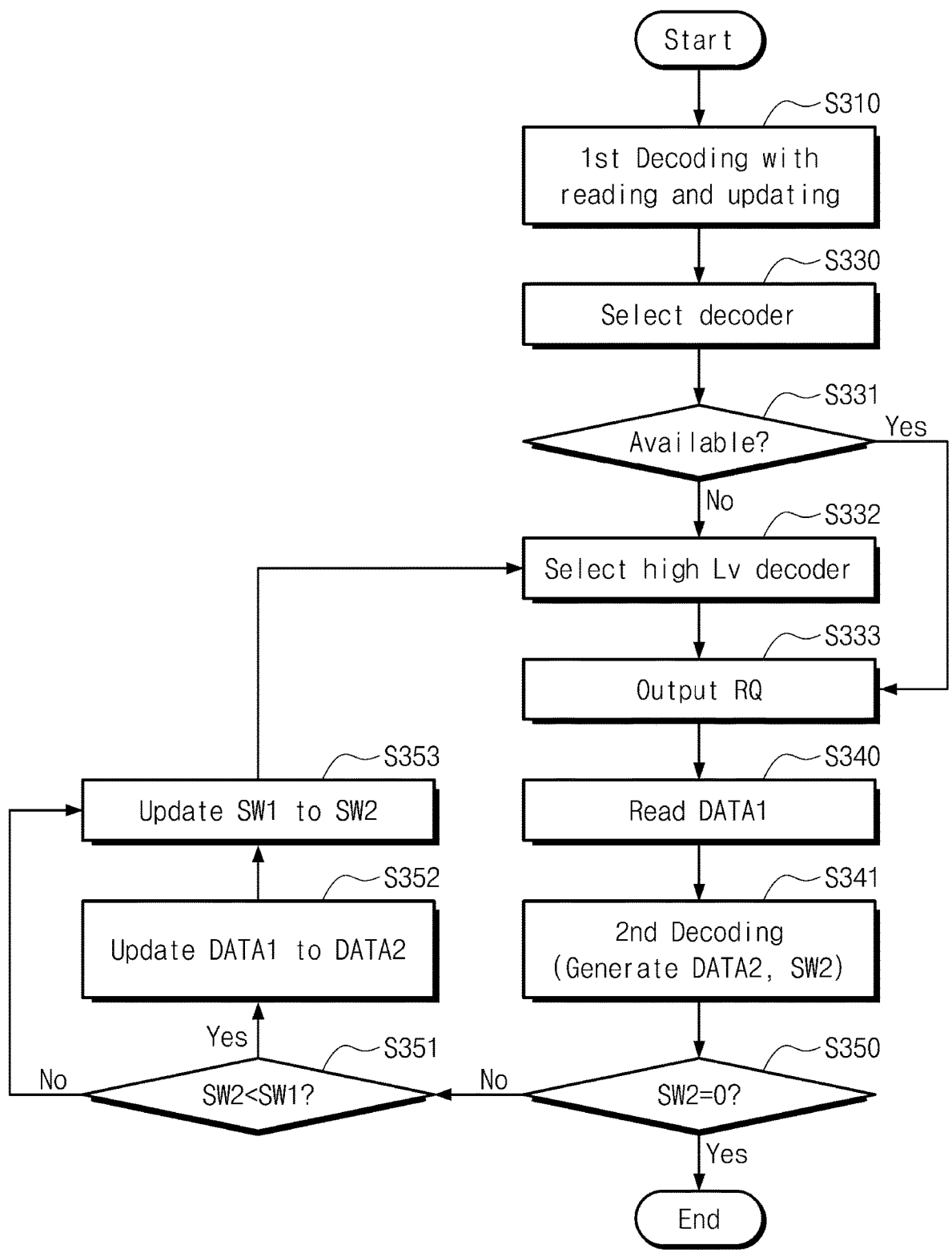
FIG. 9 is a flowchart illustrating an operating method of a storage controller of FIG. 1, according to an exemplary embodiment.

FIG. 9 is a flowchart illustrating an operating method of a storage controller of FIG. 1, according to an exemplary embodiment. Referring to FIGS. 1 and 9, an operating method of a storage device according to an exemplary embodiment is exemplified. Operation S310 of FIG. 9 is similar to a combination of operation S210 and operation S211 of FIG. 6, and operation S340, operation S341, operation S350, operation S351, operation S352, and operation S353 are similar to operation S240, operation S241, operation S250, operation S251, operation S252, and operation S253 of FIG. 6. Thus, repeated description will be omitted for conciseness and to avoid redundancy.

In operation S330, the storage controller 1100 may select a decoder, which will decode the first data DATA1, based on the first syndrome weight SW1. In an exemplary embodiment, the storage controller 1100 may include at least three decoders of different error correction capabilities.

For example, the storage controller 1100 may include a first level decoder, a second level decoder, and a third level decoder. When the first syndrome weight SW1 is a first reference value or less, the storage controller 1100 may select the first level decoder. When the first syndrome weight SW1 exceeds the first reference value and is a second reference value or less, the storage controller 1100 may select the second level decoder. When the first syndrome weight SW1 exceeds the second reference value, the storage controller 1100 may select the third level decoder.

In operation S331, the storage controller 1100 may check whether the decoder selected in operation S330 is available. When the selected decoder is available, the storage controller 1100 may perform operation S333. When the selected decoder is unavailable, the storage controller 1100 may perform operation S332.

In operation S332, the storage controller 1100 may select a higher level decoder of a higher error correction capability than the decoder selected in operation S330. In an exemplary embodiment, the higher level decoder of the higher error correction capability may correct an error that another decoder of a lower error correction capability is capable of correcting.

For example, in the case where the first data DATA1 has an error corresponding to a second level, the second level decoder may correct an error of the first data DATA1. The third level decoder of a higher error correction capability than the second level decoder may also correct the error of the first data DATA1. In this case, a processing time of the third level decoder may be longer than a processing time of the second level decoder. However, the processing time of the third level decoder may still be shorter than a waiting time that it would take for the second level decoder, which is unavailable, to become available.

In operation S333, the request signal RQ for requesting decoding of the first data DATA1 may be output to the selected decoder. In this case, the selected decoder may be the decoder selected in operation S330 or the higher level decoder selected in operation S332.

Figure 10:
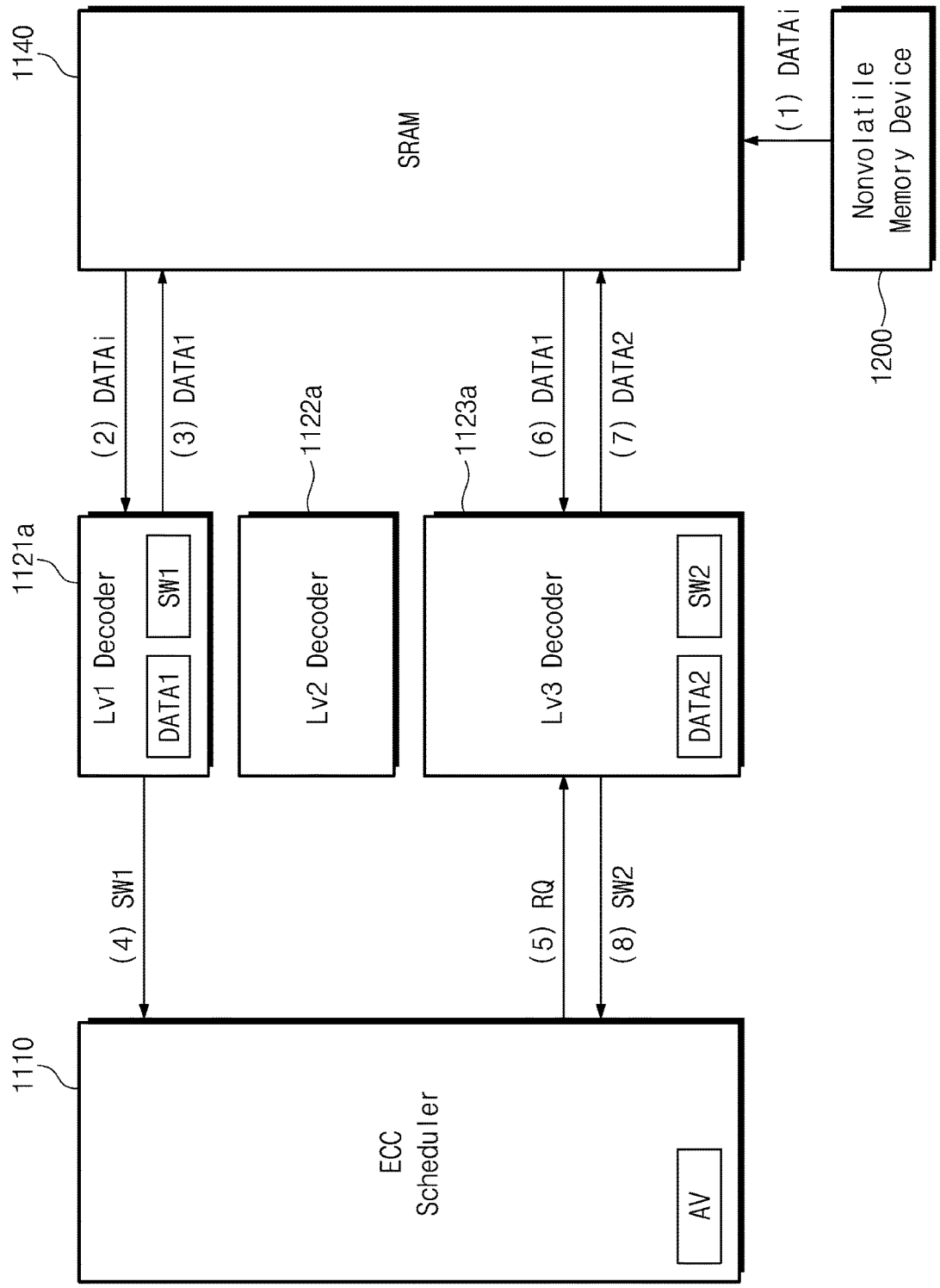
FIG. 10 is a block diagram illustrating a storage device in which an operating method of FIG. 9 is implemented, according to an exemplary embodiment.

FIG. 10 is a block diagram illustrating a storage device in which an operating method of FIG. 9 is implemented, according to an exemplary embodiment. A storage device that selects another decoder of a higher error correction capability than a selected decoder to perform decoding when the selected decoder is unavailable is illustrated in FIG. 10 as an example. Characteristics of the nonvolatile memory device 1200, the SRAM 1140, and the first level decoder 1121a are similar to those described with reference to FIG. 7, and thus, repeated description will be omitted to avoid redundancy.

The ECC scheduler 1110 may receive the first syndrome weight SW1 from the first level decoder 1121a at (4). The ECC scheduler 1110 may select the second level decoder 1122a based on the first syndrome weight SW1 thus received. The ECC scheduler 1110 may include available information AV indicating whether the second level decoder 1122a is available. For example, when the ECC scheduler 1110 outputs another request signal to the second level decoder 1122a and does not receive another syndrome weight, the ECC scheduler 1110 may determine that the second level decoder 1122a is unavailable.

The ECC scheduler 1110 may determine that the second level decoder 1122a is unavailable, based on the available information AV. The ECC scheduler 1110 may select the third level decoder 1123a of a higher error correction capability than the second level decoder 1122a. The ECC scheduler 1110 may output the request signal RQ for requesting decoding of the first data DATA1 to the third level decoder 1123a at (5).

The third level decoder 1123a may receive the request signal RQ at (5). The third level decoder 1123a may read the first data DATA1 from the SRAM 1140 at (6), and decode the first data DATA1. The third level decoder 1123a may generate the second data DATA2 and the second syndrome weight SW2. In this case, a speed at which the third level decoder 1123a decodes the first data DATA1 may be slower than a speed at which the second level decoder 1122a of FIG. 7 decodes the first data DATA1. However, a time taken for the third level decoder 1123a to decode the first data DATA1 may still be shorter than a waiting time that it would take to wait for the second level decoder 1122a, which unavailable, to become available.

Figure 11:
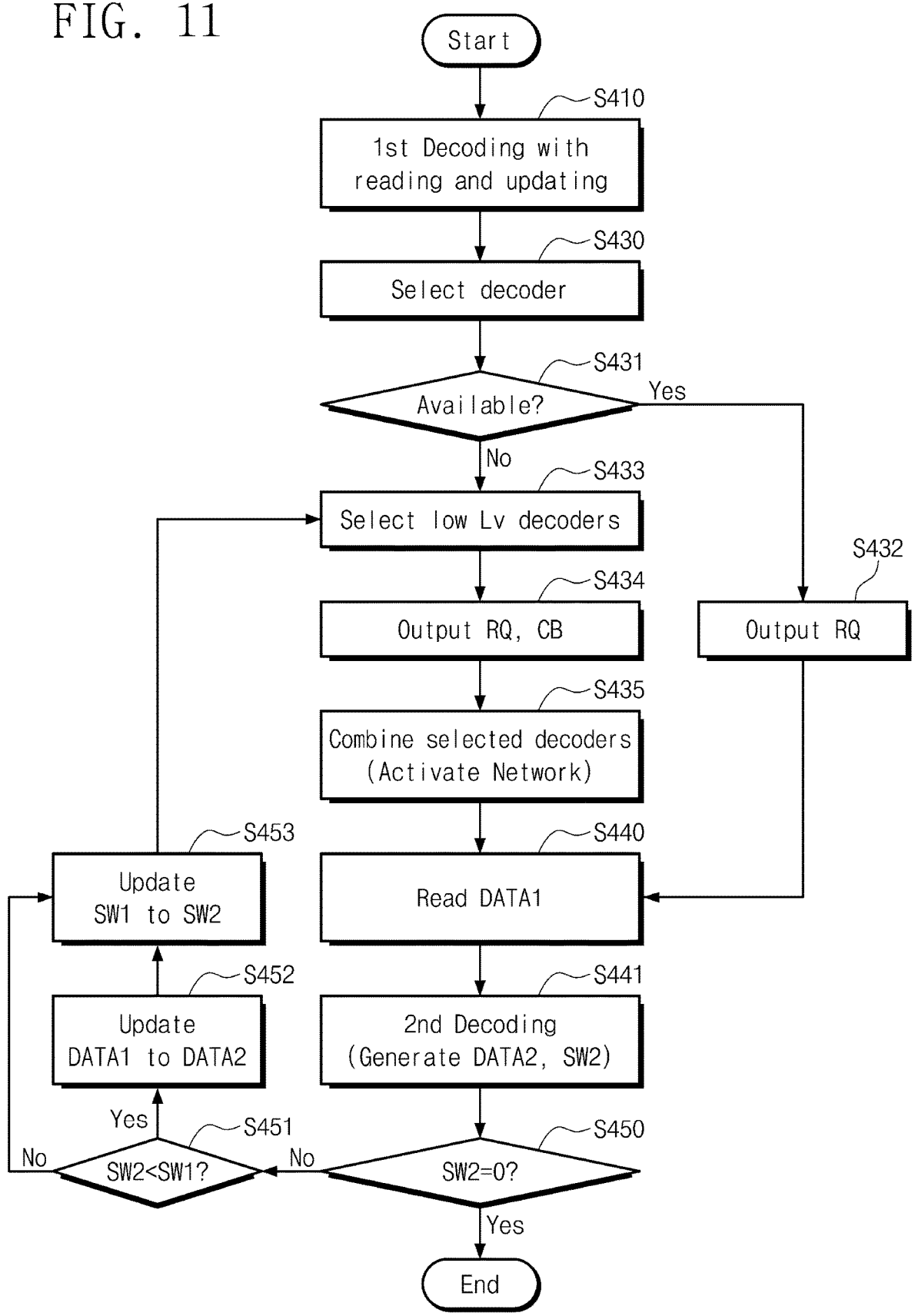
FIG. 11 is a flowchart illustrating an operating method of a storage controller of FIG. 1, according to an exemplary embodiment.

FIG. 11 is a flowchart illustrating an operating method of a storage controller of FIG. 1, according to an exemplary embodiment. Referring to FIGS. 1 and 11, an operating method of a storage device according to an exemplary embodiment is exemplified. Operation S410 of FIG. 11 is similar to a combination of operation S210 and operation S211 of FIG. 6, and operation S440, operation S441, operation S450, operation S451, operation S452, and operation S453 are similar to operation S240, operation S241, operation S250, operation S251, operation S252, and operation S253 of FIG. 6. Thus, repeated description will be omitted for conciseness and to avoid redundancy.

In operation S430, the storage controller 1100 may select a decoder, which will decode the first data DATA1, based on the first syndrome weight SW1. In operation S431, the storage controller 1100 may check whether the decoder selected in operation S430 is available. When the selected decoder is available, the storage controller 1100 may perform operation S432, in which the request signal RQ is output to the selected decoder. When the selected decoder is unavailable, the storage controller 1100 may perform operation S433.

In operation S433, the storage controller 1100 may select a plurality of lower level decoders of a lower error correction capability than the decoder selected in operation S430. In an exemplary embodiment, the storage controller 1100 may include a higher level decoder, and the plurality of lower level decoders may operate like the higher level decoder through a combination of the plurality of lower level decoders.

In operation S434, the storage controller 1100 may output the request signal RQ for requesting decoding of the first data DATA1 and a combination signal CB for combining the selected lower level decoders, to the selected lower level decoders.

In operation S435, the lower level decoders receiving the combination signal CB may be combined. The combined lower level decoders may operate like one higher level decoder as a network is activated.

In an exemplary embodiment, a time taken to select and combine lower level decoders may be shorter than a waiting time that it would take to wait for a selected higher level decoder, which is unavailable, to become available.

In operation S440, a decoder included in the storage controller 1100 may read the first data DATA1 stored in the storage controller 1100 in response to the request signal RQ. In this case, the decoder may be the decoder selected in operation S430, or lower level decoders that are selected in operation S433 and are combined in operation S435.

Figure 12:
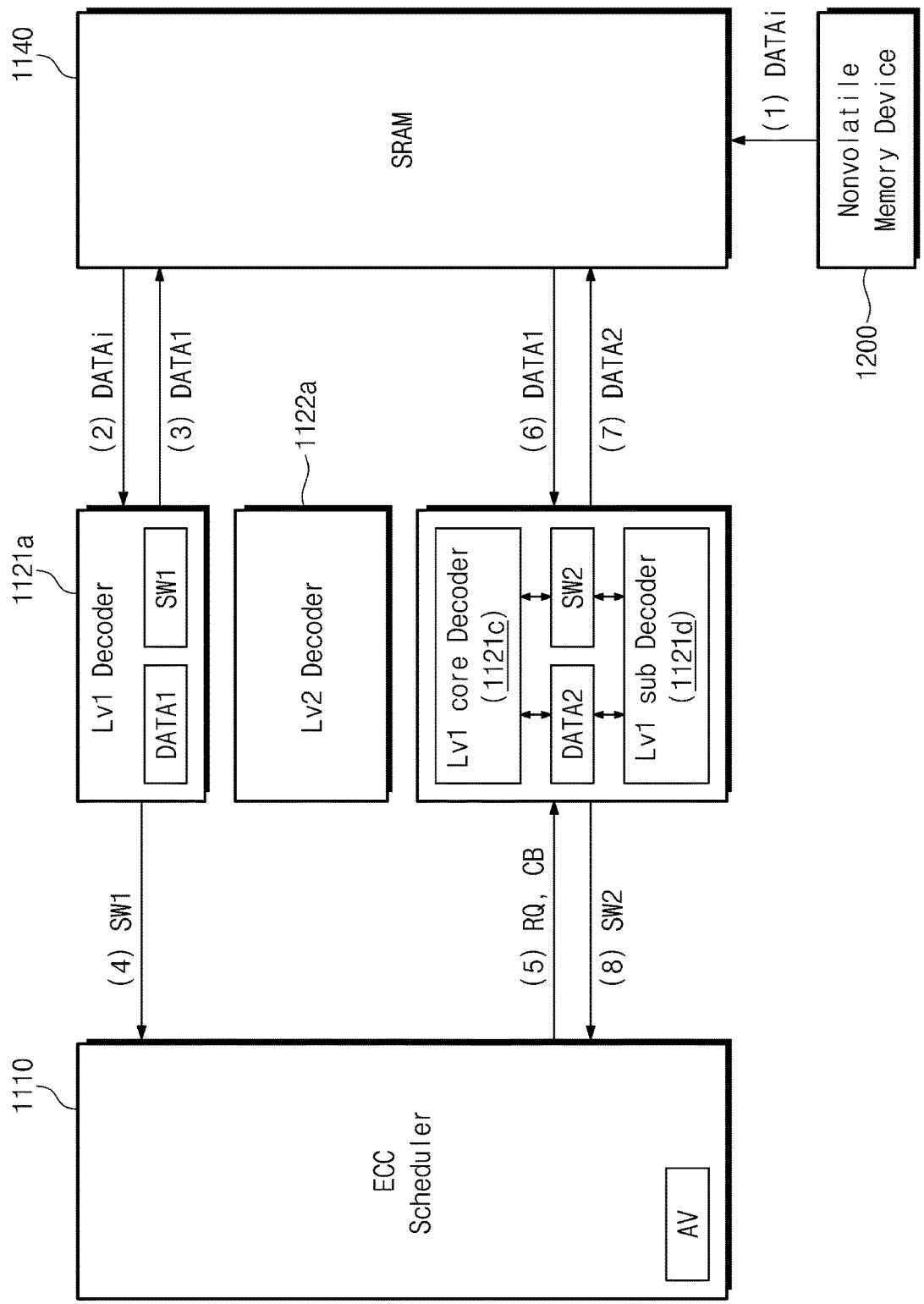
FIG. 12 is a block diagram illustrating a storage device in which an operating method of FIG. 11 is implemented, according to an exemplary embodiment.

FIG. 12 is a block diagram illustrating a storage device in which an operating method of FIG. 11 is implemented, according to an exemplary embodiment. A storage device that selects and combines other decoders of a lower error correction capability than a selected decoder when the selected decoder is unavailable and performs decoding is illustrated in FIG. 12 as an example. Characteristics of the nonvolatile memory device 1200, the SRAM 1140, and the first level decoder 1121a are similar to those described with reference to FIG. 7, and thus, repeated description will be omitted for conciseness and to avoid redundancy.

The ECC scheduler 1110 may receive the first syndrome weight SW1 from the first level decoder 1121a in (4). The ECC scheduler 1110 may select the second level decoder 1122a based on the first syndrome weight SW1 thus received. The ECC scheduler 1110 may include available information AV indicating whether the second level decoder 1122a is available.

The ECC scheduler 1110 may determine that the second level decoder 1122a is unavailable, based on the available information AV. The ECC scheduler 1110 may select a first level core decoder 1121c and a first level sub decoder 1121d, of which error correction capabilities are lower than an error correction capability of the second level decoder 1122a. The ECC scheduler 1110 may output the request signal RQ and the combination signal CB to the first level core decoder 1121c and the first level sub decoder 1121d thus selected at (5). The combination signal may be a signal for requesting a combination of the first level core decoder 1121c and the first level sub decoder 1121d.

In this case, an error of the first data DATA1 may be an error exceeding the error correction capacity of each of the first level core decoder 1121c and the first level sub decoder 1121d, individually. The error of the first data DATA1 may be correctable by the second level decoder 1122a.

The first level core decoder 1121c and the first level sub decoder 1121d may be combined based on the combination signal CB. The first level core decoder 1121c and the first level sub decoder 1121d, thus combined, may read the first data DATA1 from the SRAM 1140 at (6) and may generate the second data DATA2 and the second syndrome weight SW2 based on the read first data DATA1.

In this case, a sum of a time taken for the ECC scheduler 1110 to determine whether the second level decoder 1122a is available based on the available information AV and a time taken to combine the first level core decoder 1121c and the first level sub decoder 1121d based on the combination signal CB may be shorter than a waiting time that is would take to wait for the second level decoder 1122a, which is unavailable, to become available.

Figures 13A, 13B:
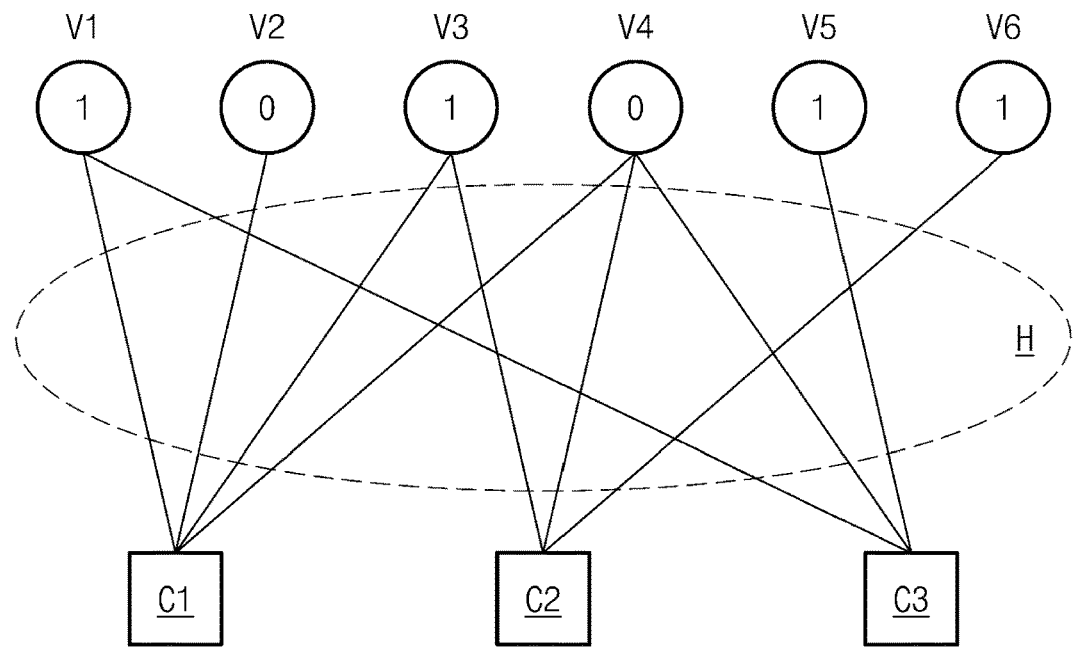
FIG. 13A is a diagram illustrating a parity check operation that a first level decoder of FIG. 12 performs, according to an exemplary embodiment.
FIG. 13B is a diagram illustrating a parity check matrix of FIG. 13A, according to an exemplary embodiment.

FIG. 13A is a diagram illustrating a parity check operation that a first level decoder of FIG. 12 performs, according to an exemplary embodiment. A method in which the first level decoder 1121a of FIG. 12 checks an error of the initial data DATAi will be described in FIGS. 12 and 13 as an example.

In an exemplary embodiment, the first level decoder 1121a may include a plurality of variable nodes V1 to V6 and a plurality of check nodes C1 to C3. An example is illustrated in FIG. 13A as the first level decoder 1121a includes 6 variable nodes V1 to V6 and 3 check nodes C1 to C3, but exemplary embodiments are not limited thereto.

For example, in the first level decoder 1121*a*, the number of variable nodes and the number of check nodes may increase or decrease.

In an exemplary embodiment, the initial data DATAi that the first level decoder 1121*a* reads may be stored to the variable nodes V1 to V6. The variable nodes V1 to V6 may be connected with the check nodes C1 to C3 based on information of a parity check matrix "H". The check nodes C1 to C3 may check whether bits stored in the variable nodes V1 to V6 satisfy an error detection rule. A bit that is stored at a variable node not satisfying the error detection rule may be flipped. The bit flipping may denote that a bit stored at a variable node is flipped from "1" to "0" or from "0" to "1" so as to satisfy the error detection rule.

For example, bit information stored at the variable nodes V1 to V6 may be "101011", as illustrated in FIG. 13A. Each of the check nodes C1 to C3 may check whether to satisfy an error detection rule that makes a bit sum of connected variable nodes even-numbered.

The first check node C1 may be connected with the first to fourth variable nodes V1 to V4. A bit sum of variable nodes connected with the first check node C1 may be even-numbered. The second check node C2 may be connected with the third, fourth, and sixth variable nodes V3, V4, and V6. A bit sum of variable nodes connected with the second check node C2 may be even-numbered. The third check node C3 may be connected with the first, fourth, and fifth variable nodes V1, V4, and V5. A bit sum of variable nodes connected with the third check node C3 may be even-numbered.

In this case, the first level decoder 1121*a* may output first data having the same bit information as the initial data DATAi. A value of the first syndrome weight SW1 output from the first level decoder 1121*a* may be "0".

In an exemplary embodiment, a configuration to connect a variable node and a check node may be expressed as an edge. An edge value may move through an edge connecting a variable node and a check node. In the case of an edge transferring a message of one bit, an edge value may include an edge sign value. In the case of an edge transferring a message of two or more bits, an edge value may include an edge sign value and an edge magnitude value.

FIG. 13B is a diagram illustrating a parity check matrix of FIG. 13A, according to an exemplary embodiment. The parity check matrix "H" of FIG. 13A is illustrated in FIG. 13B in the form of a numerical value. Referring to FIGS. 13A and 13B, each of elements included in the parity check matrix "H" may have a value of "1" when a connection between a variable node and a check node exists and may have a value of "0" when a connection between a variable node and a check node does not exist.

For example, the element at the second row and third column of the parity check matrix "H" may be a value of "1". In this case, the second check node C2 and the third variable node V3 may be connected. The element at the third row and sixth column of the parity check matrix "H" may be a value of "0". In this case, the third check node C3 and the sixth variable node V6 may not be connected.

In an exemplary embodiment, the first level decoder 1121*a* may check an error of a bit based on a product of the parity check matrix "H" and a column vector including bit information of the variable nodes V1 to V6. For example, a column vector including information of "222" may be calculated at the check nodes C1 to C3 by multiplying the parity check matrix "H" including bit information illustrated in FIG. 13B and a column vector including bit information of "101011" together. Because all elements included in the calculated column vector are even-numbered, the bit information of "101011" may be checked as an error does not exist.

Figure 14:
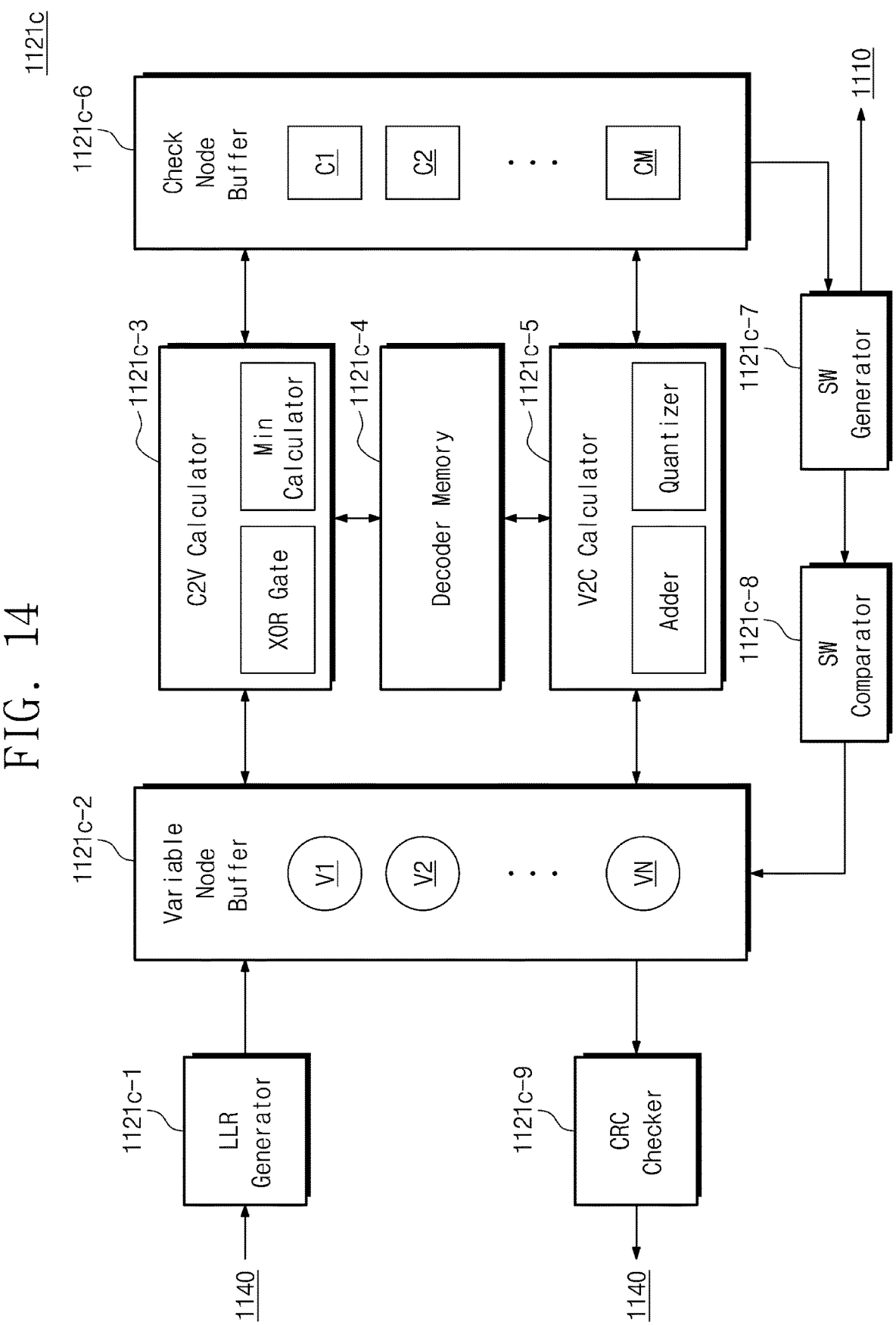
FIG. 14 is block diagram illustrating a first level core decoder of FIG. 12, according to an exemplary embodiment.

FIG. 14 is block diagram illustrating a first level core decoder of FIG. 12, according to an exemplary embodiment. The first level core decoder 1121*c* that decodes any buffer data to output decoded data without combination with the first level sub decoder 1121*d* will be described with reference to FIGS. 12 and 14 as an example.

The first level core decoder 1121*c* may be connected with the ECC scheduler 1110 and the SRAM 1140. The first level core decoder 1121*c* may include an LLR generator 1121*c*-1, a variable node buffer 1121*c*-2, a C2V calculator 1121*c*-3, a decoder memory 1121*c*-4, a V2C calculator 1121*c*-5, a check node buffer 1121*c*-6, a syndrome weight (SW) generator 1121*c*-7, a syndrome weight (SW) comparator 1121*c*-8, and a CRC checker 1121*c*-9.

The LLR generator 1121*c*-1 may receive buffer data from the SRAM 1140. The LLR generator 1121*c*-1 may calculate a log likelihood ratio (LLR) based on the received buffer data. The LLR may be a result of taking the log of a ratio of probability that a value of a specific bit is "0" to the probability that the value of the specific bit is "1".

The variable node buffer 1121*c*-2 may receive the calculated LLR from the LLR generator 1121*c*-1. The variable node buffer 1121*c*-2 may include a plurality of variable nodes V1 to VN. The plurality of variable nodes V1 to VN may store bit information of buffer data.

The C2V calculator 1121*c*-3 may be connected with the variable node buffer 1121*c*-2, the decoder memory 1121*c*-4, and the check node buffer 1121*c*-6. The C2V calculator 1121*c*-3 may use an edge value, which is transferred from the variable node buffer 1121*c*-2 to the check node buffer 1121*c*-6, as an input value. The C2V calculator 1121*c*-3 may use an edge value, which is transferred from the check node buffer 1121*c*-6 to the variable node buffer 1121*c*-2, as an output value.

In an exemplary embodiment, the C2V calculator 1121*c*-3 may include an XOR gate. The C2V calculator 1121*c*-3 may perform an XOR operation on edge values that are transferred from the variable node buffer 1121*c*-2 to the check node buffer 1121*c*-6. The C2V calculator 1121*c*-3 may decide an edge value, which is transferred from the check node buffer 1121*c*-6 to the variable node buffer 1121*c*-2, based on a result of the XOR operation. The decided edge value may be stored to the decoder memory 1121*c*-4.

In an exemplary embodiment, the C2V calculator 1121*c*-3 may further include a min calculator. The min calculator may be a device that calculates an edge magnitude value included in an edge value of two or more bits. For example, in the case where the first level core decoder 1121*c* processes an edge value of two bits through a combination with the first level sub decoder 1121*d*, the first level core decoder 1121*c* may calculate an edge magnitude value through the min calculator.

In an exemplary embodiment, the C2V calculator 1121*c*-3 may amend bit information of the variable node buffer 1121*c*-2 based on the decided edge value. The C2V calculator 1121*c*-3 may decode buffer data by iterating the process of amending a portion of the buffer data stored in the variable node buffer 1121*c*-2. Data that are generated by decoding the buffer data may be decoded data. After the process of amending a portion of the buffer data is iterated, data stored in the variable node buffer 1121*c*-2 may be decoded data.

The decoder memory 1121*c*-4 may be connected with the C2V calculator 1121*c*-3 and the V2C calculator 1121*c*-5.

The decoder memory 1121c-4 may exchange edge information of one bit with the C2V calculator 1121c-3 and the V2C calculator 1121c-5. The decoder memory 1121c-4 may store edge information of one bit. For example, the decoder memory 1121c-4 may exchange a message of one bit. The decoder memory 1121c-4 may store an edge sign value.

The V2C calculator 1121c-5 may be connected with the variable node buffer 1121c-2, the decoder memory 1121c-4, and the check node buffer 1121c-6. The V2C calculator 1121c-5 may use an edge value, which is transferred from the check node buffer 1121c-6 to the variable node buffer 1121c-2, as an input value. The V2C calculator 1121c-5 may use an edge value, which is transferred from the variable node buffer 1121c-2 to the check node buffer 1121c-6, as an output value.

In an exemplary embodiment, the V2C calculator 1121c-5 may include an adder and a quantizer. The adder included in the V2C calculator 1121c-5 may be a device that processes a message exchanged between the check node buffer 1121c-6 and the variable node buffer 1121c-2. The quantizer included in the V2C calculator 1121c-5 may be a device that decides an edge, which is transferred from the variable node buffer 1121c-2 to the check node buffer 1121c-6, based on a processing result of the adder.

In an exemplary embodiment, the quantizer included in the V2C calculator 1121c-5 may be a high-accuracy quantizer that is manufactured in consideration of an error correction operation after a combination of the first level core decoder 1121c and the first level sub decoder 1121d. For example, the quantizer included in the V2C calculator 1121c-5 may process an edge value of two bits.

The check node buffer 1121c-6 may be connected with the C2V calculator 1121c-3 and the V2C calculator 1121c-5. The check node buffer 1121c-6 may check an error level of data stored in the variable node buffer 1121c-2 based on the exchanged edge value. The check node buffer 1121c-6 may output information corresponding to a result of checking an error level to the syndrome weight generator 1121c-7.

In an exemplary embodiment, the check node buffer 1121c-6 may output information corresponding to a result of checking an error level of buffer data stored in the variable node buffer 1121c-2 to the syndrome weight generator 1121c-7.

In an exemplary embodiment, the check node buffer 1121c-6 may output information corresponding to a result of checking an error level of decoded data stored in the variable node buffer 1121c-2 to the syndrome weight generator 1121c-7.

The syndrome weight generator 1121c-7 may receive information corresponding to a result of checking an error level from the check node buffer 1121c-6. The syndrome weight generator 1121c-7 may generate a syndrome weight based on the received information. The syndrome weight generator 1121c-7 may output the generated syndrome weight to the syndrome weight comparator 1121c-8 and the ECC scheduler 1110.

In an exemplary embodiment, the syndrome weight generator 1121c-7 may receive information corresponding to a result of checking an error level of buffer data. The syndrome weight generator 1121c-7 may generate a syndrome weight indicating the error level of the buffer data. The syndrome weight generator 1121c-7 may output the syndrome weight of the buffer data to the syndrome weight comparator 1121c-8 and the ECC scheduler 1110.

In an exemplary embodiment, the syndrome weight generator 1121c-7 may receive information corresponding to a result of checking an error level of decoded data. The syndrome weight generator 1121c-7 may generate a syndrome weight indicating the error level of the decoded data. The syndrome weight generator 1121c-7 may output the syndrome weight of the decoded data to the syndrome weight comparator 1121c-8 and the ECC scheduler 1110.

The syndrome weight comparator 1121c-8 may receive a syndrome weight from the syndrome weight generator 1121c-7. The syndrome weight comparator 1121c-8 may store the syndrome weight. The syndrome weight comparator 1121c-8 may control the output of data stored in the variable node buffer 1121c-2 depending on the syndrome weight.

In an exemplary embodiment, the syndrome weight comparator 1121c-8 may determine whether the syndrome weight of the buffer data is "0". When the syndrome weight of the buffer data is "0", under control of the syndrome weight comparator 1121c-8, the buffer data stored in the variable node buffer 1121c-2 may be output to a host.

In an exemplary embodiment, the syndrome weight comparator 1121c-8 may receive and store the syndrome weight of the buffer data. The syndrome weight comparator 1121c-8 may store the syndrome weight of the decoded data. The syndrome weight comparator 1121c-8 may compare the stored syndrome weight of the buffer data and the received syndrome weight of the decoded data.

When the syndrome weight of the decoded data is smaller than the syndrome weight of the buffer data, under control of the syndrome weight comparator 1121c-8, the decoded data stored in the variable node buffer 1121c-2 may be output to the SRAM 1140. As such, the SRAM 1140 may store data having a low error level from among the buffer data and the decoded data.

The CRC checker 1121c-9 may perform cyclic redundancy check (CRC) on the decoded data that are output from the variable node buffer 1121c-2 to the SRAM 1140. The CRC checker 1121c-9 may output the decoded data, on which the cyclic redundancy check is performed, to the SRAM 1140.

Figure 15:
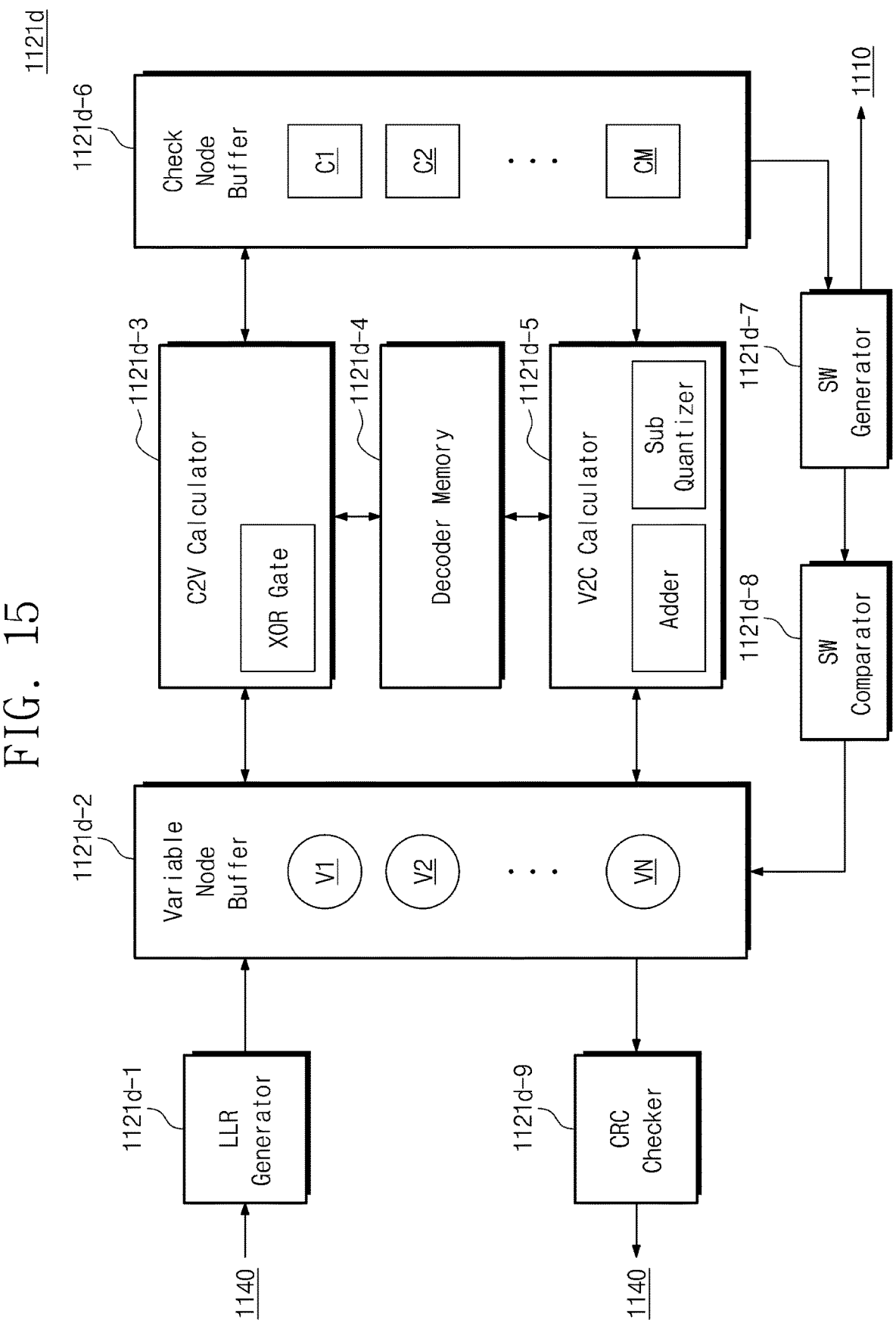
FIG. 15 is block diagram illustrating a first level sub decoder of FIG. 12, according to an exemplary embodiment.

FIG. 15 is block diagram illustrating a first level sub decoder of FIG. 12, according to an exemplary embodiment. The first level sub decoder 1121d that decodes any buffer data to output decoded data without combination with the first level core decoder 1121c will be described with reference to FIGS. 12 and 15 as an example.

Characteristics of an LLR generator 1121d-1, a variable node buffer 1121d-2, a decoder memory 1121d-4, a check node buffer 1121d-6, a syndrome weight generator 1121d-7, a syndrome weight comparator 1121d-8, and a CRC checker 1121d-9 may be similar to the characteristics of the LLR generator 1121c-1, the variable node buffer 1121c-2, the decoder memory 1121c-4, the check node buffer 1121c-6, the syndrome weight generator 1121c-7, the syndrome weight comparator 1121c-8, and the CRC checker 1121c-9 of FIG. 14, and thus, repeated description will be omitted for conciseness and to avoid redundancy.

A C2V calculator 1121d-3 may perform an XOR operation on edge values that are transferred from the variable node buffer 1121d-2 to the check node buffer 1121d-6. The C2V calculator 1121c-3 may decide an edge value, which is transferred from the check node buffer 1121c-6 to the variable node buffer 1121c-2, based on a result of the XOR operation.

In an exemplary embodiment, the C2V calculator 1121d-3 may omit the min calculator. The first level sub decoder 1121d may be a decoder that corrects an error of one bit. After being combined with the first level core decoder 1121c, the first level sub decoder 1121d may share the min calculator included in the first level core decoder 1121c. Accordingly, the first level sub decoder 1121d may omit the min calculator to calculate an edge magnitude value.

A V2C calculator 1121d-5 may use an edge value, which is transferred from the check node buffer 1121d-6 to the variable node buffer 1121d-2, as an input value. The V2C calculator 1121d-5 may use an edge value, which is transferred from the variable node buffer 1121d-2 to the check node buffer 1121d-6, as an output value.

In an exemplary embodiment, the V2C calculator 1121d-5 may include a sub quantizer having the accuracy of one bit. After being combined with the first level core decoder 1121c, the first level sub decoder 1121d may share the quantizer that has the accuracy of two bits and is included in the first level core decoder 1121c. Accordingly, the first level sub decoder 1121d may omit the quantizer having a correction capacity of two bits exceeding a correction capacity.

Figure 16:
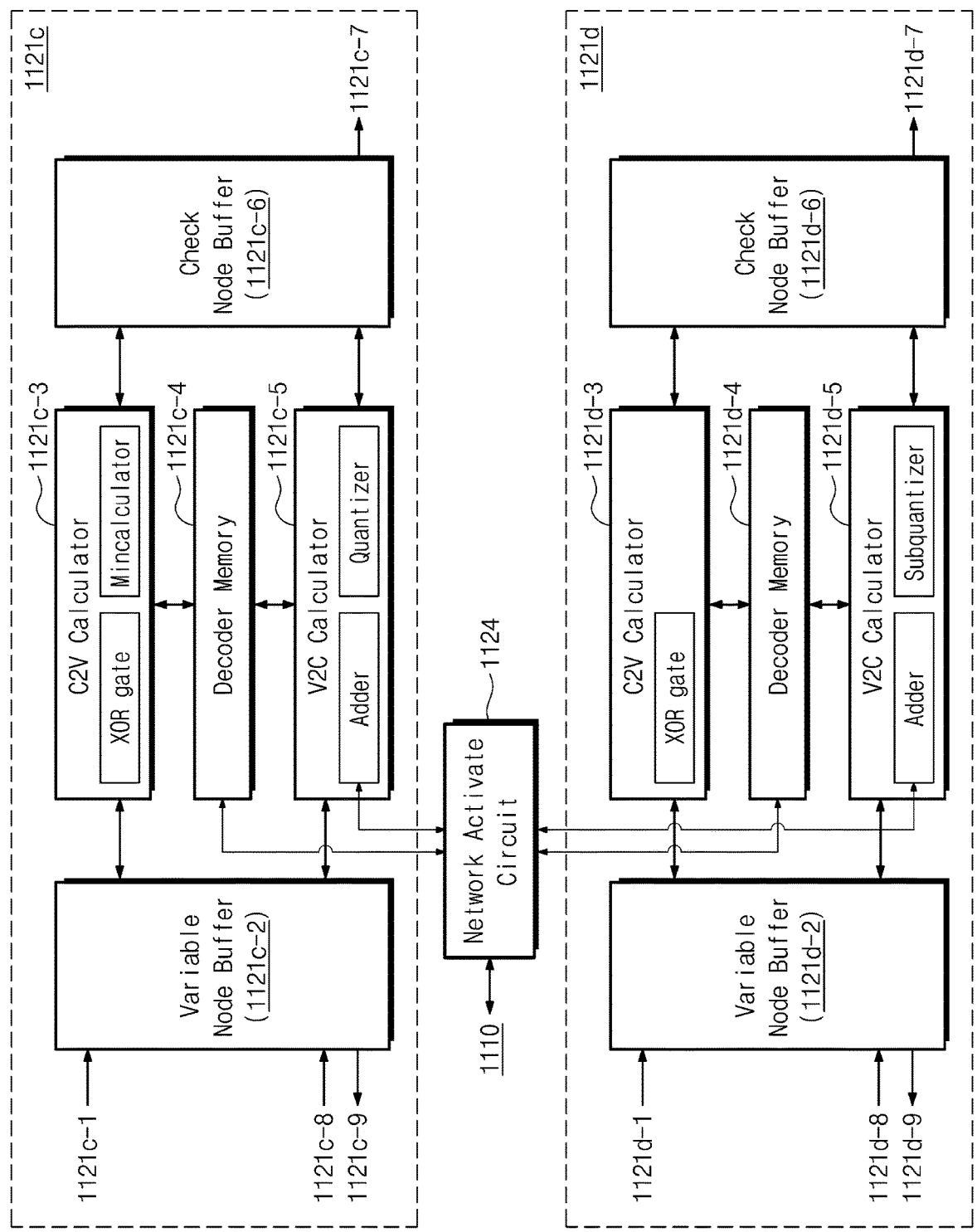
FIG. 16 is a block diagram illustrating how first level decoders of FIG. 12 are combined, according to an exemplary embodiment.

FIG. 16 is a block diagram illustrating how first level decoders of FIG. 12 are combined, according to an exemplary embodiment. The first level core decoder 1121c and the first level sub decoder 1121d that are combined based on the combination signal CB output from the ECC scheduler 1110 will be described with reference to FIGS. 12 and 16 as an example. Characteristics of the components 1121c-1 to 1121c-9 of the first level core decoder 1121c and the components 1121d-1 to 1121d-9 of the first level sub decoder 1121d are similar to those described with reference to FIGS. 14 and 15, and thus, repeated description will be omitted for conciseness and to avoid redundancy.

A network activate circuit 1124 may be connected with the first level core decoder 1121c and the first level sub decoder 1121d. The network activate circuit 1124 may receive the combination signal CB from the ECC scheduler 1110. The network activate circuit 1124 may activate a network between the first level core decoder 1121c and the first level sub decoder 1121d in response to the received combination signal CB. The first level core decoder 1121c and the first level sub decoder 1121d linked through the activated network may operate similar to a second level decoder.

In an exemplary embodiment, the network activate circuit 1124 may activate a memory share of the first level core decoder 1121c and the first level sub decoder 1121d. For example, the decoder memory 1121c-4 of the first level core decoder 1121c may be utilized as a memory storing an edge sign value. The decoder memory 1121d-4 of the first level sub decoder 1121d may be utilized as a memory storing an edge magnitude value. The combined decoders 1121c and 1121d may store edge information of two bits by sharing a memory.

In an exemplary embodiment, the network activate circuit 1124 may activate a logical share of the first level core decoder 1121c and the first level sub decoder 1121d. The first level core decoder 1121c and the first level sub decoder 1121d between which the logical share is activated may share a calculator.

For example, the adder included in the V2C calculator 1121c-5 of the first level core decoder 1121c and the adder included in the V2C calculator 1121d-5 of the first level sub decoder 1121d may be logically shared. The decoder memories 1121c-4 and 1121d-4 may be shared. In detail, the adder of each of the V2C calculators 1121c-5 and 1121d-5 may process a 1-bit message. The adders of the respective V2C calculators 1121c-5 and 1121d-5 may operate as one adder and may process a 2-bit message. The processed 2-bit message may be distributed and stored into the decoder memories 1121c-4 and 1121d-4.

An example is illustrated in FIG. 16 as the first level core decoder 1121c and the first level sub decoder 1121d between which the logical share is activated share the V2C calculators 1121c-5 and 1121d-5, but exemplary embodiments are not limited thereto. For example, the first level core decoder 1121c and the first level sub decoder 1121d between which the logical share is activated may share the C2V calculators 1121c-3 and 1121d-3. Alternatively, the first level core decoder 1121c and the first level sub decoder 1121d between which the logical share is activated may share a quantizer or may further share any other logics (not illustrated) performing an operation corresponding to error correction.

FIG. 17 is a diagram illustrating an edge value that combined decoder memories of FIG. 16 process, according to an exemplary embodiment. A 2-bit edge value is illustrated in FIG. 17 as an example. One of four different values may be expressed by the 2-bit edge value. The 2-bit edge value may include an edge sign value and an edge magnitude value.

For example, the edge sign value of "1" may indicate that a sign of an edge value is a positive sign. The edge sign value of "0" may indicate that a sign of an edge value is a negative sign. The edge magnitude value of "1" may indicate that a magnitude of an edge value is large. The edge magnitude value of "0" may indicate that a magnitude of an edge value is small.

In an exemplary embodiment, the 2-bit edge value bits corresponding to the number "1" may be expressed by "10". In this case, an edge sign value may be "1". The edge sign value may indicate that a sign of the number "1" is a positive sign. The edge magnitude value may be "0". The edge magnitude value may indicate that the magnitude of the number "1" is smaller than another number (e.g., the number "2").

Figure 18:
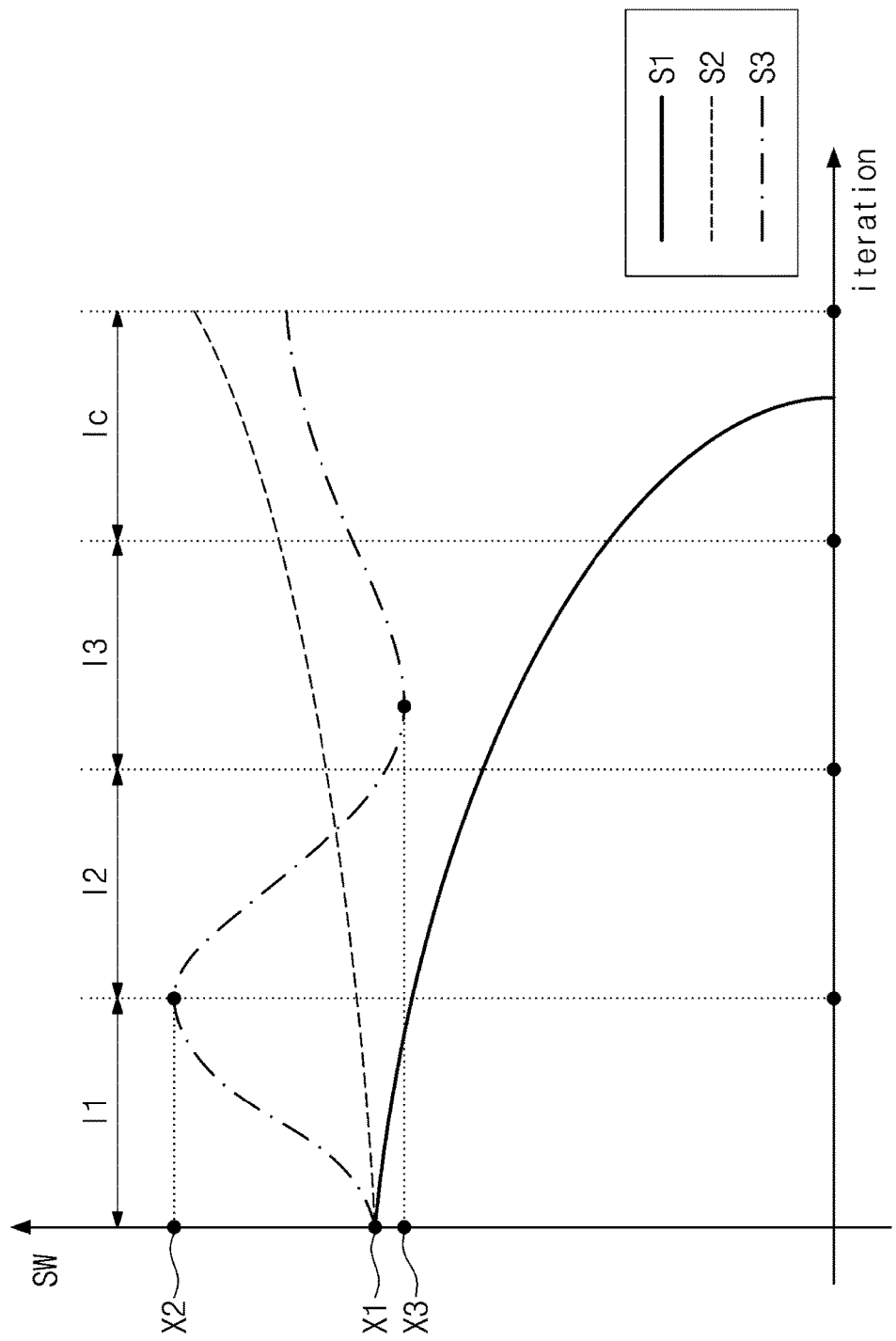
FIG. 18 is a graph illustrating a syndrome weight that an ECC core device outputs, according to an exemplary embodiment.

FIG. 18 is a graph illustrating a syndrome weight that an ECC core device according to an exemplary embodiment outputs. The syndrome weight SW that an ECC core device performing decoding on an iteration interval basis outputs to an ECC scheduler is illustrated in FIG. 18 as an example.

A first scenario S1 is a scenario showing the case where the syndrome weight SW decreases as the decoding is repeatedly performed. The first scenario S1 is illustrated by a solid line.

The first scenario S1 may include first to third iteration intervals I1 to I3 and a critical iteration interval Ic. In each of the iteration intervals, an operation according to a message exchange between a variable node buffer and a check node buffer may be repeatedly performed. The ECC core device may perform decoding based on the operation that is repeatedly performed. The critical iteration interval Ic may denote an interval in which an operation is finally performed regardless of whether the decoding is successful. An example is illustrated as the first scenario S1 includes four iteration intervals, but exemplary embodiments are not limited thereto. For example, the number of iteration intervals to be included in the first scenario S1 may increase or decrease.

A second scenario S2 is a scenario showing the case where the syndrome weight SW increases as the decoding is repeatedly performed. The second scenario S2 is illustrated by a dotted line.

The syndrome weight SW may gradually increase in the first to third iteration intervals I1 to I3 of the second scenario S2. The ECC scheduler may select a decoder, of which a correction capacity gradually increases in the first to third iteration intervals I1 to I3 of the second scenario S2. The syndrome weight SW may reach a maximum value in the critical iteration interval Ic of the second scenario S2. An error level of decoded data of the critical iteration interval Ic may be higher than an error level of decoded data of the first iteration interval I1. Data stored in an SRAM being a buffer memory may not be updated to the decoded data of the critical iteration interval Ic.

A third scenario S3 is a scenario showing the case where the syndrome weight SW increases or decreases as the decoding is repeatedly performed. The third scenario S3 is illustrated by a dash-single dotted line.

The syndrome weight SW may increase from a first value X1 to a second value X2 in the first iteration interval I1 of the third scenario S3. Data that are stored in the buffer memory and correspond to the syndrome weight SW of the first value X1 may not be updated to decoded data corresponding to a syndrome weight of the second value X2.

The syndrome weight SW may have a third value X3 in the third iteration interval I3 of the third scenario S3. A syndrome weight of the third value X3 may be a minimum value within the whole of the iteration intervals I1, I2, and I3 of the third scenario S3. Data that are stored in the buffer memory may be updated to decoded data corresponding to a syndrome weight of the third value X3.

Figure 19:
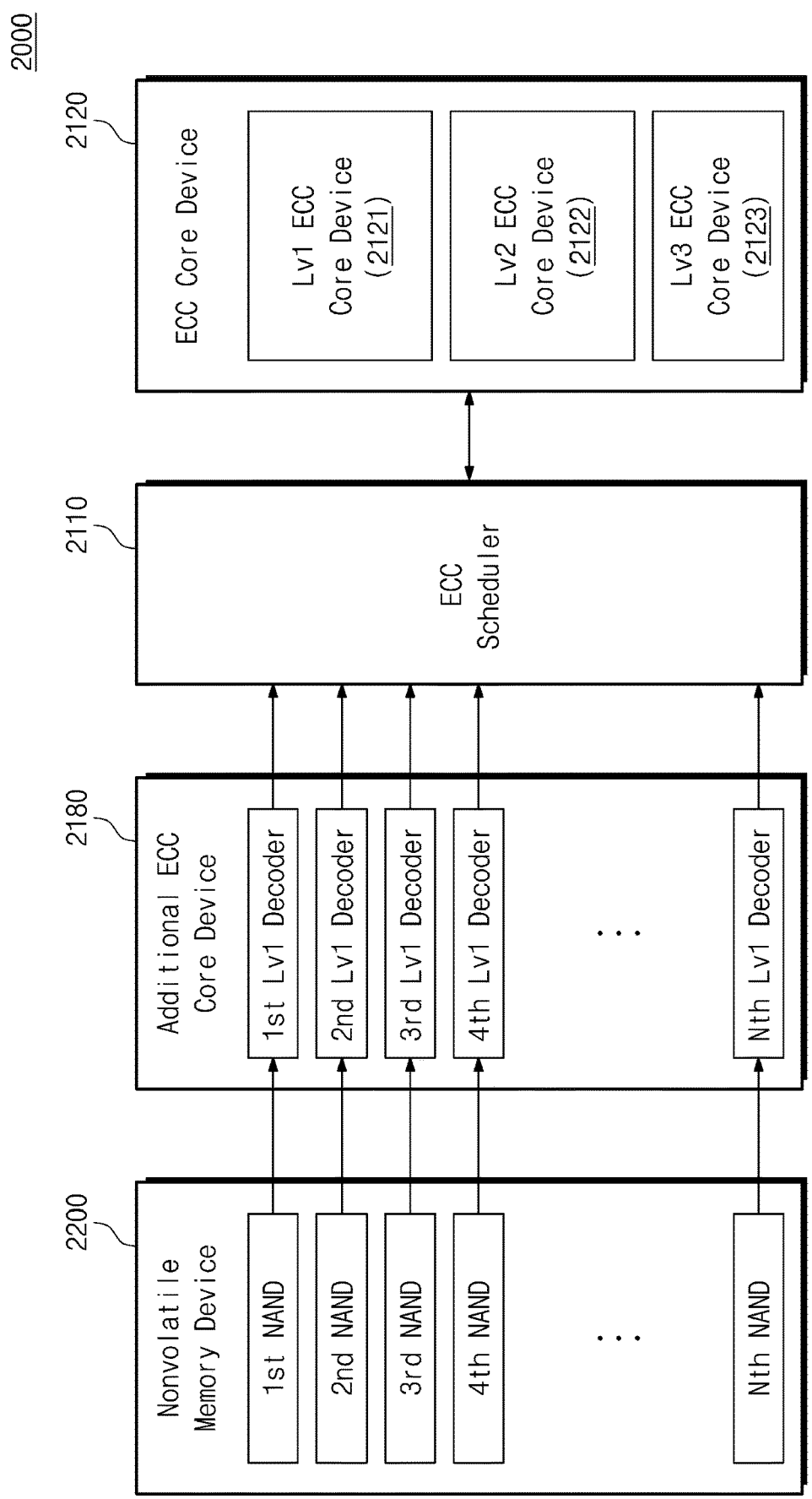
FIG. 19 is a block diagram illustrating a storage device according to an exemplary embodiment.

FIG. 19 is a block diagram illustrating a storage device according to an exemplary embodiment. Referring to FIG. 19, a storage device 2000 according to an exemplary embodiment is exemplified. The storage device 2000 may include a nonvolatile memory device 2200, an ECC scheduler 2110, an ECC core device 2120, and an additional ECC core device 2180. The nonvolatile memory device 2200, the ECC scheduler 2110, and the ECC core device 2120 are similar to the nonvolatile memory device 1200, the ECC scheduler 1110, and the ECC core device 1120 of FIG. 3, and thus, repeated description will be omitted to avoid redundancy.

The additional ECC core device 2180 may include a plurality of first level (Lv1) decoders. The plurality of first level decoders may be connected with a plurality of NAND flash memories included in the nonvolatile memory device 2200, respectively. Each of the plurality of first level decoders may decode data stored in the corresponding NAND flash memory and may output a syndrome weight of the decoded data to the ECC scheduler 2110.

In an exemplary embodiment, decoding may be required to calculate a syndrome weight of initial data stored in the nonvolatile memory device 2200. A decoder that will decode the initial data may be selected regardless of a syndrome weight. As the additional ECC core device 2180 connected with the nonvolatile memory device 2200 decodes the initial data, with regard to the ECC scheduler 2110, the burden of selecting a decoder that will decode the initial data may be decreased. Accordingly, a speed at which the storage device 2000 reads data may be improved.

According to an exemplary embodiment, it may be possible to cope with various scenarios using a lesser number of error processing devices since a plurality of semiconductor memories share error processing devices having different error correction capabilities. According, a storage controller with a decreased chip area, a storage device including the same, and an operating method thereof may be provided.

Also, since error correction devices of a low error correction capacity are utilized like an error correction device of a high error correction capacity through a combination, the chip area may be further decreased, and a next error processing operation may be performed based on data that an error processing device processes. Accordingly, a storage controller with improved throughput, a storage device including the same, and an operating method thereof may be provided.

While various exemplary embodiments have been described, it will be apparent to those of ordinary skill in the art that various changes and modifications may be made thereto without departing from the spirit and scope of the present disclosure as set forth in the following claims.

What is claimed is:

1. An operating method of a storage controller which includes a high level decoder and a low level decoder, the method comprising:
generating first data that is a result of decoding initial data that is read from a nonvolatile memory device, and a first syndrome weight indicating an error level of the first data;
outputting the first data to a host when the first syndrome weight is a specific value;
selecting the high level decoder having a first error correction capability to decode the first data, when the first syndrome weight exceeds a reference value; and
selecting the low level decoder having a second error correction capability lower than the first error correction capability to decode the first data, when the first syndrome weight is the reference value or less.

2. The method of claim 1, further comprising:
generating second data that is a result of decoding the first data, and a second syndrome weight indicating an error level of the second data, at the selected high level decoder or the selected low level decoder.

3. The method of claim 2, further comprising:
outputting the second data to the host when the second syndrome weight is the specific value.

4. The method of claim 2, further comprising:
storing the first data that is the result of decoding the initial data; and
updating the first data to the second data when the second syndrome weight is smaller than the first syndrome weight.

5. The method of claim 2, further comprising:
selecting the high level decoder to decode the second data, when the second syndrome weight exceeds the reference value; and
selecting the low level decoder to decode the second data, when the second syndrome weight is the reference value or less.

6. The method of claim 1, wherein the selecting the low level decoder includes:
checking whether the low level decoder is available; and
in response to the low level decoder being unavailable, selecting the high level decoder instead of the low level decoder to decode the first data.

7. The method of claim 1, wherein the selecting of the high level decoder to decode the first data includes:
checking whether the high level decoder is available; and
in response to the high level decoder being unavailable:
selecting the low level decoder and another low level decoder different from the low level decoder, instead of the high level decoder;
combining the selected low level decoder and the selected another low level decoder into a combined low level decoder; and
selecting the combined low level decoder as the high level decoder.

8. The method of claim 7, wherein the combined low level decoder shares a calculator included in each of the selected low level decoder and the selected another low level decoder.

9. The method of claim 7, wherein the combined low level decoder shares a decoder memory included in each of the selected low level decoder and the selected another low level decoder.

10. A storage controller comprising:
an error correction code (ECC) core device including a decoder connected with a nonvolatile memory device configured to store initial data, a high level decoder having a first error correction capability, and a low level decoder having a second error correction capability lower than the first error correction capability; and
an ECC scheduler configured to receive a first syndrome weight from the decoder, to output a request signal for requesting decoding of first data to the high level decoder when the first syndrome weight exceeds a reference value, and to output the request signal to the low level decoder when the first syndrome weight is the reference value or less,
wherein the decoder reads the initial data from the nonvolatile memory device, generates the first data that is a result of decoding the read initial data and generates the first syndrome weight indicating an error level of the first data, outputs the first data to a host when the first syndrome weight is a specific value, and outputs the first data to the high level decoder or the low level decoder that receives the request signal, when the first syndrome weight is not the specific value.

11. The storage controller of claim 10, wherein the ECC core device is further configured to receive the request signal from the ECC scheduler, and to output second data that is a result of decoding the first data and a second syndrome weight indicating an error level of the second data based on the received request signal.

12. The storage controller of claim 11, further comprising:
a buffer memory configured to receive the first data from the decoder and to store the received first data,
wherein the ECC core device is configured to update the first data stored in the buffer memory to the second data when the second syndrome weight is smaller than the first syndrome weight.

13. The storage controller of claim 10, wherein the ECC scheduler is further configured to check whether the low level decoder is available when the first syndrome weight is the reference value or less and, in response to the low level decoder being unavailable, to output the request signal to the high level decoder instead of the low level decoder.

14. The storage controller of claim 10, wherein the ECC core device further includes another low level decoder having the second error correction capability, and
wherein the ECC scheduler is further configured to check whether the high level decoder is available when the first syndrome weight exceeds the reference value and, in response to the high level decoder being unavailable, to output the request signal to the low level decoder and the another low level decoder, instead of the high level decoder.

15. The storage controller of claim 14, wherein a calculator included in each of the low level decoder and the another low level decoder is shared.

16. The storage controller of claim 14, wherein a decoder memory included in each of the low level decoder and the another low level decoder is shared.

17. A storage device comprising:
a first level decoder having a first error correction capability, and configured to generate first data that is a result of decoding initial data read from a nonvolatile memory device and to generate a first syndrome weight indicating an error level of the first data;
a second level decoder having a second error correction capability higher than the first error correction capability;
a third level decoder having a third error correction capability higher than the second error correction capability; and
an ECC scheduler configured to receive the first syndrome weight, to output a request signal for requesting decoding of the first data to the third level decoder when the first syndrome weight exceeds a reference value, and to output the request signal to the second level decoder when the first syndrome weight is the reference value or less,
wherein the first level decoder is configured to output the first data to a host when the first syndrome weight is a specific value and to output the first data to the second level decoder or the third level decoder that receives the request signal, when the first syndrome weight is not the specific value.

18. The storage device of claim 17, wherein the nonvolatile memory device includes a first nonvolatile memory storing the initial data and a second nonvolatile memory storing another initial data different from the initial data,
wherein the first level decoder is further configured to generate another first data that is a result of decoding the another initial data read from the second nonvolatile memory and to generate another first syndrome weight indicating an error level of the another first data, and
wherein the ECC scheduler is further configured to receive the another first syndrome weight, to output another request signal for requesting decoding of the another first data to the third level decoder when the another first syndrome weight exceeds the reference value, and to output the another request signal to the second level decoder when the another first syndrome weight is the reference value or less.

19. The storage device of claim 17, further comprising a plurality of first level decoders,
wherein the nonvolatile memory device includes a plurality of nonvolatile memories, the plurality of nonvolatile memories store a plurality of initial data, respectively, and the plurality of initial data are respectively decoded by the plurality of first level decoders.

20. The storage device of claim 17, further comprising "N" first level decoders, "M" second level decoders, and "K" third level decoders, wherein the "K" is a natural number, the "M" is a natural number greater than the "K", and the "N" is a natural number greater than the "M".

* * * * *